United States Patent
Tanaka et al.

(10) Patent No.: US 9,312,349 B2
(45) Date of Patent: Apr. 12, 2016

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventors: Tetsuhiro Tanaka, Kanagawa (JP); Takayuki Inoue, Kanagawa (JP); Yoshitaka Yamamoto, Kanagawa (JP); Hideomi Suzawa, Kanagawa (JP); Tamae Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/322,555

(22) Filed: Jul. 2, 2014

(65) Prior Publication Data

US 2015/0011048 A1   Jan. 8, 2015

(30) Foreign Application Priority Data

Jul. 8, 2013   (JP) .................................. 2013-142340

(51) Int. Cl.
*H01L 21/00*   (2006.01)
*H01L 29/423*   (2006.01)
(Continued)

(52) U.S. Cl.
CPC ........ *H01L 29/4234* (2013.01); *H01L 29/4908* (2013.01); *H01L 29/7869* (2013.01); *H01L 29/78696* (2013.01)

(58) Field of Classification Search
CPC ..................... H01L 29/4234; H01L 29/66833; H01L 29/792; H01L 21/28282

USPC .......................................................... 438/104
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Reema Patel
*Assistant Examiner* — Syed Gheyas
(74) *Attorney, Agent, or Firm* — Fish & Richardson P.C.

(57) ABSTRACT

To provide a semiconductor device in which the threshold value is controlled. Furthermore, to provide a semiconductor device in which a deterioration in electrical characteristics which becomes more noticeable as a transistor is miniaturized can be suppressed. The semiconductor device includes a first semiconductor film, a source electrode and a drain electrode electrically connected to the first semiconductor film, a gate insulating film, and a gate electrode in contact with the gate insulating film. The gate insulating film includes a first insulating film and a trap film, and charge is trapped in a charge trap state in an interface between the first insulating film and the trap film or inside the trap film.

18 Claims, 21 Drawing Sheets

(51) Int. Cl.
*H01L 29/49* (2006.01)
*H01L 29/786* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,259,433 B2 | 8/2007 | Nomoto et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,851,296 B2 | 12/2010 | Noda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0059744 A1* | 3/2010 | Yin ................ H01L 21/84 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0240991 A1 | 10/2011 | Yamazaki |
| 2011/0309876 A1 | 12/2011 | Terau et al. |
| 2012/0056175 A1 | 3/2012 | Takemura |
| 2014/0034946 A1 | 2/2014 | Yamazaki et al. |
| 2014/0042437 A1 | 2/2014 | Yamazaki |
| 2014/0042438 A1 | 2/2014 | Yamazaki |
| 2014/0077205 A1 | 3/2014 | Yamazaki et al. |
| 2014/0103337 A1 | 4/2014 | Yamazaki et al. |
| 2014/0103346 A1 | 4/2014 | Yamazaki |
| 2014/0131702 A1 | 5/2014 | Matsubayashi et al. |
| 2014/0138675 A1 | 5/2014 | Yamazaki |
| 2015/0008428 A1 | 1/2015 | Yamamoto et al. |
| 2015/0011046 A1 | 1/2015 | Tanaka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-203917 | 7/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-270766 | 11/2008 |
| JP | 2012-074692 | 4/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO System [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IWD '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

A •———————• B

A •———————• B

C •———————• D

C •———————• D measuring initial characteristics trapping electrons measurment resin sealing, packaging FIG. 16A  FIG. 16B
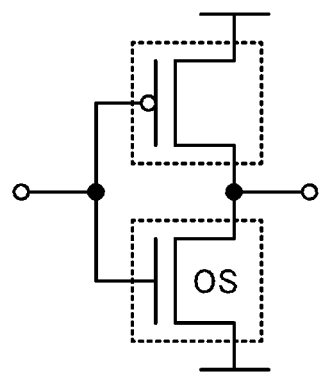
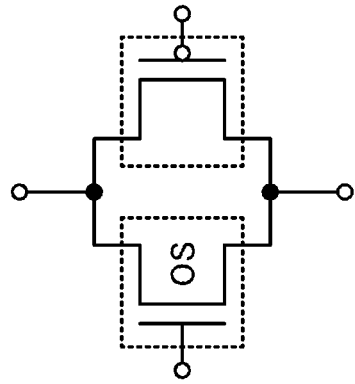
FIG. 16C
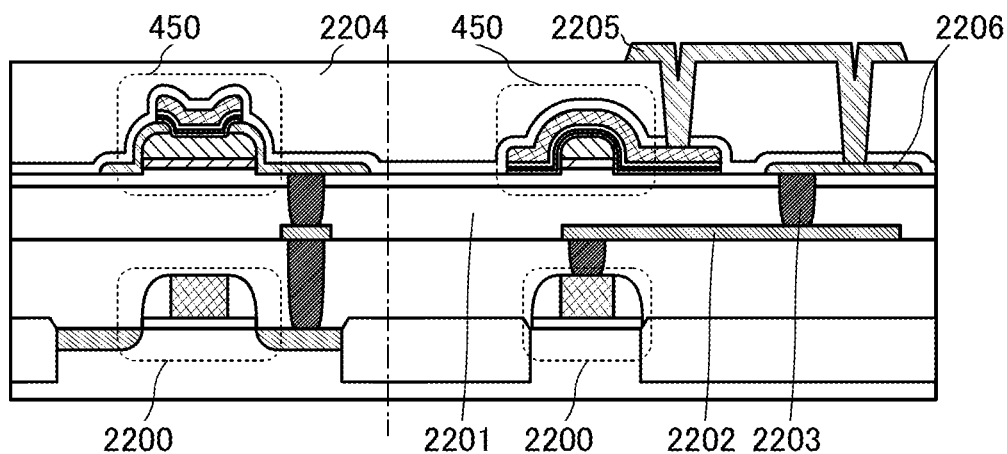
FIG. 16D
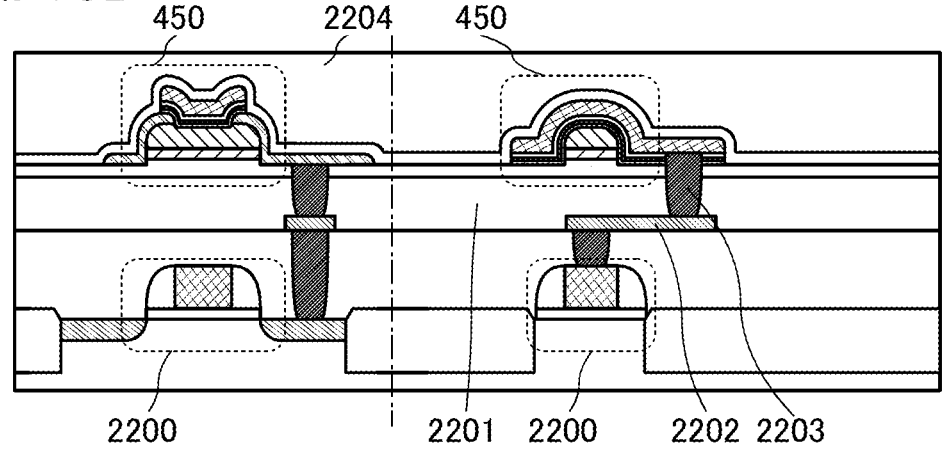

SEMICONDUCTOR DEVICE AND METHOD FOR MANUFACTURING SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention particularly relates to a semiconductor device and a method for manufacturing the semiconductor device.

In this specification, a semiconductor device generally means a device which can function by utilizing semiconductor characteristics. A display device, an electro-optical device, a semiconductor circuit, and an electronic device include a semiconductor device in some cases.

2. Description of the Related Art

Attention has been focused on a technique for forming a transistor using a semiconductor thin film formed over a substrate having an insulating surface (the transistor is also referred to as thin film transistor (TFT)). The transistor is applied to a wide range of electronic devices such as an integrated circuit (IC) or an image display device (display device).

In accordance with an increase in integration of a circuit, a transistor is miniaturized. When the transistor is miniaturized, there is a possibility that electrical characteristics of the transistor, such as the on-state current, the off-state current, the threshold voltage (hereinafter, referred to as threshold value), and the subthreshold swing value (S-value) degrade. When the channel length is decreased, an increase of the off-state current, an increase of the shift of the threshold value, and an increase of the S-value generally occur. When the channel width is decreased, the on-state current is reduced.

As the current at which the voltage between a gate and a source is 0 V (Icut current) is small, the power consumption of the circuit is lowered and the leakage of charge is suppressed. In an n-channel transistor, the Icut current is increased when the threshold value of the transistor shifts on the negative side. Thus, in order to reduce the Icut current, the threshold value needs to be shifted on the positive side. However, when the threshold value is excessively shifted on the positive side, the operating voltage of a circuit is too high, and the power consumption is increased. The threshold value of the transistor needs to be controlled to suppress the leakage of charge and lower the power consumption of the transistor. In description of Patent Document 1, charge is trapped in a gate insulating film to control the threshold value.

An insulating film containing silicon and nitrogen is known as an effective trap film, which is a material capable of trapping both electrons and holes. Thus, by injecting either of the carriers in accordance with a desired threshold value, the threshold value can be adjusted to be on either the positive side or the negative side. In addition, a film with high trap density can be formed by adjusting the film formation conditions (see Patent Document 2), and a film with high retention capability can be formed (see Patent Document 3).

REFERENCE

Patent Document

[Patent Document 1] Japanese Published Patent Application No. 2012-074692
[Patent Document 2] Japanese Published Patent Application No. 2002-203917
[Patent Document 3] Japanese Published Patent Application No. 2008-270766

SUMMARY OF THE INVENTION

In a conventional technique of controlling the threshold value as described above, a high voltage is required to be applied when charge is trapped in a trap film. In the case where a floating gate layer is used as a trap film, it is necessary to surround the floating gate layer with an insulating layer to prevent the trapped charge from leaking from the trap film; the manufacturing process is complicated.

An object of one embodiment of the present invention is to provide a semiconductor device in which the threshold value is compensated. Another object is to provide a semiconductor device in which deterioration of electrical characteristics which becomes more noticeable as the semiconductor device is miniaturized can be suppressed. Another object is to provide a highly integrated semiconductor device. Another object is to provide a semiconductor device in which deterioration of on-state current characteristics is reduced. Another object of one embodiment of the present invention is to provide a semiconductor device with low power consumption. Another object of one embodiment of the present invention is to provide a semiconductor device with high reliability. Another object is to provide a semiconductor device which can retain data even when power supply is stopped. Another object is to provide a semiconductor device with excellent characteristics.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first semiconductor film, a source electrode and a drain electrode electrically connected to the first semiconductor film, a gate electrode, and a gate insulating film between the first semiconductor film and the gate electrode, and the gate insulating film includes a charge trap layer.

Another embodiment of the present invention is a semiconductor device including a first semiconductor film, a source electrode and a drain electrode electrically connected to the first semiconductor film, a gate electrode, and a gate insulating film between the first semiconductor film and the gate electrode, and the gate insulating film includes a first insulating layer and an insulating film containing silicon and nitrogen.

Another embodiment of the present invention is a method for manufacturing the above-described semiconductor device including steps of generating a difference between a potential of the gate electrode and a potential of the source electrode or the drain electrode, and keeping the potential difference for a period longer than or equal to a second at a temperature higher than or equal to 125° C. and lower than or equal to 450° C., whereby a charge is trapped in the charge trap layer (e.g., the insulating film containing silicon and nitrogen).

In the above structure, a second semiconductor film and a third semiconductor film between which the first semiconductor film is sandwiched may be included, the second semiconductor film may be below the first semiconductor film, and the third semiconductor film may be over the first semiconductor film, the source electrode and the drain electrode and below the gate insulating film.

Furthermore, in the above structure, the gate electrode preferably faces a top surface and a side surface of the first semiconductor film.

In the insulating film containing silicon and nitrogen, trap centers exist discretely; thus, when the insulating film containing silicon and nitrogen is used as a trap film, it is not necessary to surround the trap film with an insulating film. In addition, the insulating film containing silicon and nitrogen can trap not only electrons but also holes and thus has an advantage of allowing freedom of adjustment of the threshold value. For example, the threshold value can be shifted on either the positive side or the negative side. Thus, with use of the insulating film containing silicon and nitrogen as a trap film, the structure of a semiconductor device can be simplified, for example. Furthermore, the degree of freedom of circuit design of the semiconductor device can be increased, for example.

According to one embodiment of the present invention, a semiconductor device in which the threshold value is compensated can be provided. Alternatively, a semiconductor device in which a deterioration in electrical characteristics which becomes more noticeable as the transistor is miniaturized can be suppressed can be provided. Alternatively, a highly integrated semiconductor device can be provided. Alternatively, a semiconductor device in which deterioration of on-state current characteristics is reduced can be provided. Alternatively, a semiconductor device with low power consumption can be provided. Alternatively, a highly reliable semiconductor device can be provided. Alternatively, a semiconductor device which can retain data even when power supply is stopped can be provided.

BRIEF DESCRIPTION OF THE DRAWINGS

FIGS. 16A to 16D illustrate a circuit using a semiconductor device of one embodiment of the present invention.

DETAILED DESCRIPTION OF THE INVENTION

Figure 1A:
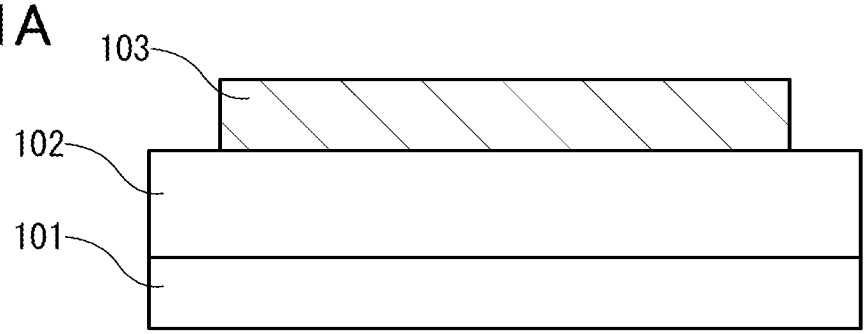
FIGS. 1A, 1B, and 1C illustrate examples of semiconductor devices of an embodiment.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Embodiment 1

In this embodiment, a structure and operating principle of a semiconductor device including a semiconductor layer, a charge trap layer, and a gate electrode will be described. FIG. 1A illustrates a semiconductor device including a semiconductor layer 101, a charge trap layer 102, and a gate electrode 103. The charge trap layer 102 can serve as a gate insulating layer.

Figure 1B:
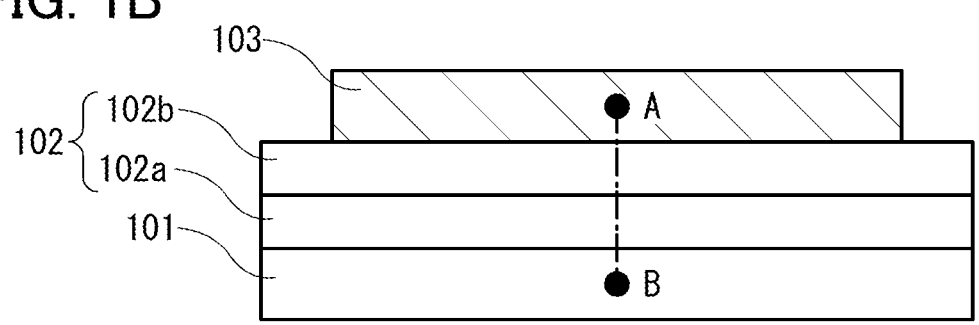
Figure 1C:
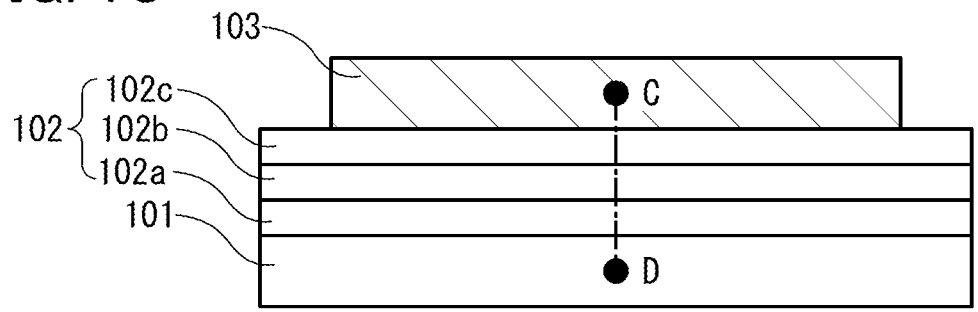

The charge trap layer 102 may be, for example, a stack of a first insulating film 102a and an insulating film 102b containing silicon and nitrogen as illustrated in FIG. 1B, a stack of the first insulating film 102a, the insulating film 102b containing silicon and nitrogen, and a second insulating film 102c as illustrated in FIG. 1C, or a stack including four or more insulating films. Note that the insulating film 102b containing silicon and nitrogen may be composed of not a single layer but a stacked film including two or more layers.

Figure 2A:
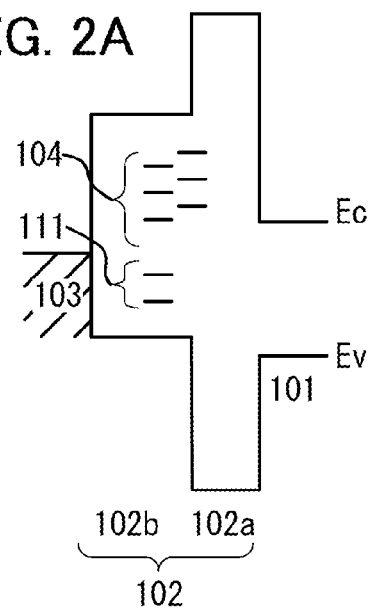
FIGS. 2A to 2D illustrate examples of band diagrams of semiconductor devices of an embodiment.

FIG. 2A illustrates an example of a band diagram in a range from a point A to a point B in the semiconductor device illustrated in FIG. 1B. In this drawing, Ec indicates the bottom of a conduction band, and Ev indicates the top of a valence band. In FIG. 2A, the potential of the gate electrode 103 is equal to that of a source electrode or a drain electrode (not shown).

Examples of the insulating film containing silicon and nitrogen include a silicon nitride film and a silicon nitride oxide film. The silicon nitride oxide film indicates a film containing more nitrogen than oxygen ($SiN_xO_y$, $x>y>0$). Note that the charge trapping capability is reduced when the proportion of contained nitrogen is lowered; thus, a film containing nitrogen less than oxygen is not suitable for a trap film.

Next, a process of trapping charge in the charge trap layer is described. Although an example of trapping electrons is described here, a process of trapping holes can be described in a manner similar to that of the process of trapping charge.

Figure 2B:
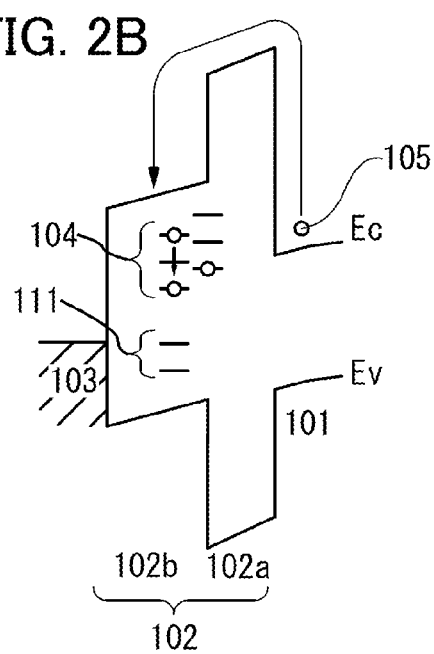

As illustrated in FIGS. 2A to 2D, an electron trap state 104 and a hole trap state 111 exist in the charge trap layer 102. Here, a process of trapping electrons in the electron trap state 104 is described. The electron trap state 104 exists at an interface between the first insulating film 102a and the insulating film 102b containing silicon and nitrogen or inside the insulating film 102b containing silicon and nitrogen. FIG. 2B shows a state where the potential of the gate electrode 103 is higher than that of the source electrode or the drain electrode. An electron 105 existing in the semiconductor layer 101 is likely to transfer toward the gate electrode 103 with a higher potential. Then, some of the electrons 105 that have transferred toward the gate electrode 103 from the semiconductor layer 101 are captured in the electron trap state 104.

Several processes in which the electron 105 reaches the insulating film 102b containing silicon and nitrogen across a barrier of the first insulating film 102a can be considered. One process (the first) is a process caused by the tunnel effect. The thinner the first insulating film is, the more prominent the tunnel effect becomes. However, in this case, the electrons trapped in the electron trap state 104 may flow out due to the tunnel effect.

Note that application of a voltage at an approximate level to the gate electrode 103 enables the tunnel effect (Fowler-Nordheim tunnel effect) to be generated even when the thickness of the first insulating film 102a is relatively large. In the case of the Fowler-Nordheim tunnel effect, the tunnel current increases with the square of the electric field between the gate electrode 103 and the semiconductor layer 101.

Another process (the second) is that the electron 105 hops from a trap state in the band gap such as a defect state in the first insulating film 102a to reach the insulating film 102b containing silicon and nitrogen. This is a conduction mechanism called Poole-Frenkel conduction in which the electric conductivity is higher as the absolute temperature is increased and the trap states are shallower.

Another process (the third) is that the electron 105 goes over the barrier of the first insulating film 102a by thermal excitation. The distribution of electrons in the semiconductor layer 101 accords to the Fermi-Dirac distribution, and the proportion of electrons with high energy becomes high generally as the temperature becomes high. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The transfer of the electron 105 toward the gate electrode 103 across the barrier of the first insulating film 102a occurs by the above three processes or the combination of these processes. In particular, the second and the third processes indicate that current increases exponentially as the temperature is higher.

Also, the Fowler-Nordheim tunnel effect is more likely to occur as the density of electrons in a thin part (a high-energy portion) of the barrier layer of the first insulating film 102a is higher; thus, a higher temperature is better.

Note that in most cases, current generated by the conduction mechanism is weak in particular when the potential of the gate electrode 103 is low (5 V or lower). However, by taking a long time for the process, a necessary number of electrons can be trapped in the electron trap states 104.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., typically higher than or equal to 150° C. and lower than or equal to 300° C.) for a second or more, typically one minute or longer. As a result, a necessary number of electrons transfers from the semiconductor layer 101 toward the gate electrode 103 and some of them are trapped in the electron trap states 104. The temperature of the process for trapping electrons is referred to as, hereinafter, process temperature.

Here, the number of electrons trapped in the electron trap states 104 can be adjusted by the potential of the gate electrode 103. When a certain number of electrons are trapped in the electron trap states 104, due to the electric charge, the electric field of the gate electrode 103 is blocked and a channel formed in the semiconductor layer 101 disappears.

The total number of electrons trapped in the electron trap states 104 increases linearly at first, and then, the rate of increase gradually decreases and the total number of electrons converges at a certain value. The convergence value depends on the potential of the gate electrode 103. As the potential is higher, the number of trapped electrons tends to be larger; however, it never exceeds the total number of electron trap states 104.

The electrons trapped in the electron trap states 104 are required not to flow out from the charge trap layer 102 to the other regions. For this, the sum of thicknesses of the first insulating film 102a and the insulating film 102b containing silicon and nitrogen is preferably set at a thickness at which the tunnel effect does not act as a problem. For example, the physical thickness (the sum of the thicknesses of the first insulating film 102a and the insulating film 102b containing silicon and nitrogen) is preferably larger than 6 nm.

However, electron transfer is hindered if the thickness of the first insulating film 102a is too large; thus, 30 nm or smaller is preferable. Furthermore, if the thicknesses of the first insulating film 102a and the insulating film 102b containing silicon and nitrogen are too large as compared with the channel length of the semiconductor device, the subthreshold value is increased to degrade the off-state characteristics. For this reason, the channel length is more than or equal to four times, typically more than or equal to ten times as large as the equivalent silicon oxide thickness of each of the first insulating film 102a and the insulating film 102b containing silicon and nitrogen.

Typically, the preferred thickness of the first insulating film 102a is greater than or equal to 3 nm and less than or equal to 10 nm, and the preferred thickness of the insulating film 102b containing silicon and nitrogen is greater than or equal to 5 nm and less than or equal to 20 nm.

Another method is to set the operating temperature or the storage temperature of the semiconductor device at a temperature that is lower enough than the process temperature. The probability that electrons go over a 3 eV-barrier when the temperature is 120° C. (393 K) is less than a one hundred-thousandth that when the temperature is 300° C. (573 K).

In the case where the electrons are trapped in the charge trap layer, it is effective to have the effective mass of holes that is extremely large or use the semiconductor layer 101 in which the hole is substantially localized. In this case, hole injection from the semiconductor layer 101 to the first insulating film 102a and the insulating film 102b containing silicon and nitrogen is not performed, and accordingly the electrons trapped in the electron trap states 104 do not disappear by being bonded to holes.

Circuit design or material selection may be made so that no voltage at which electrons trapped in the first insulating film 102a and the insulating film 102b containing silicon and nitrogen are released is applied. For example, in a material whose effective mass of holes is extremely large or the hole is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor layer 101 is extremely small and consequently the Fowler-Nordheim tunnel effect or electron conduction according to the Poole-Frenkel conduction is significantly decreased.

Figure 2C:
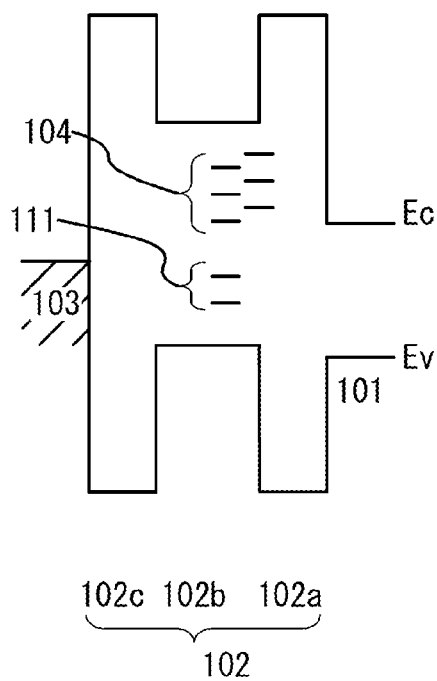
Figure 2D:
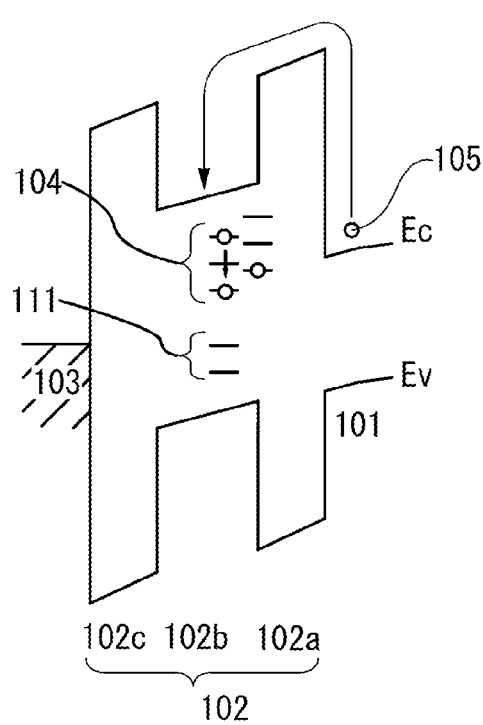

FIG. 2C illustrates an example of a band diagram along a point C to a point D in the semiconductor device illustrated in FIG. 1C. In FIG. 2C, the potential of the gate electrode 103 is equal to that of the source electrode or the drain electrode (not shown). When the potential of the gate electrode 103 is higher than that of the source electrode or the drain electrode, a state shown in FIG. 2D is obtained.

Figure 3A:
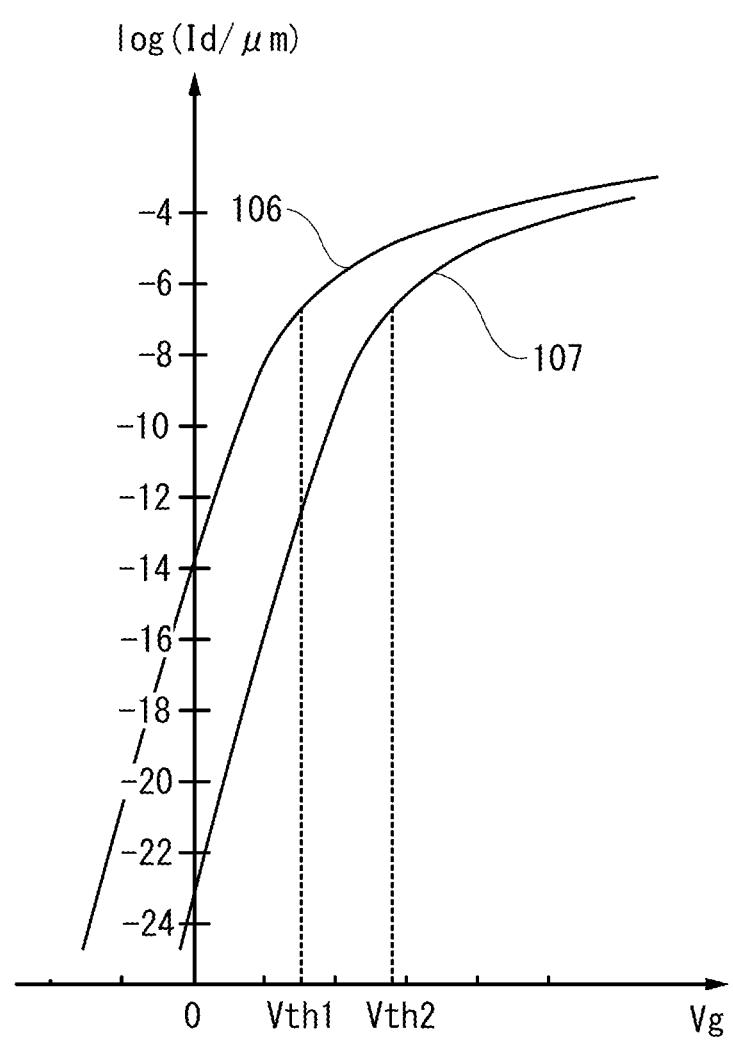
FIGS. 3A and 3B are a graph schematically showing characteristics of a semiconductor device of an embodiment and a diagram showing an example of a circuit of the semiconductor device.

As shown in FIG. 3A, the threshold value of a semiconductor device is increased by the trap of electrons in the charge trap layer 102. In particular, when the semiconductor layer 101 is formed using a wide band gap material, a source-drain current (cut-off current, Icut current) when the potential of the gate electrode 103 is equal to the potential of the source electrode can be significantly decreased.

For example, the Icut current density (a current value per micrometer of a channel width) of an In—Ga—Zn-based oxide whose band gap is 3.2 eV is 1 zA/μm ($1 \times 10^{-21}$ A/μm) or less, typically 1 yA/μm ($1 \times 10^{-24}$ A/μm) or less.

FIG. 3A schematically shows dependence of current per micrometer of channel width (Id) between source and drain electrodes on the potential of the gate electrode 103 (Vg) at room temperature, before and after electron trap in the charge trap layer 102. The potential of the source electrode is 0 V and the potential of the drain electrode is +1 V. Although current smaller than 1 fA cannot be measured directly, it can be estimated from a value measured by another method, the subthreshold value, and the like.

As indicated by a curve 106, the threshold value of the semiconductor device is $V_{th1}$ at first. After electron trapping, the threshold value increases (shifts in the positive direction) to become $V_{th2}$. As a result, the current density when Vg=0 becomes 1 aA/μm ($1 \times 10^{-18}$ A/μm) or less, for example, higher than or equal to 1 zA/μm and lower than or equal to 1 yA/μm.

Figure 3B:
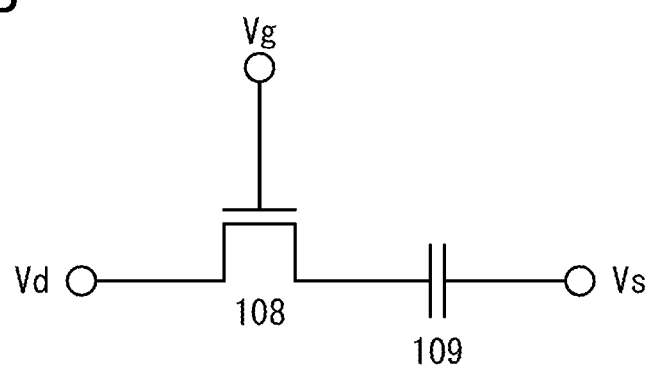

FIG. 3B illustrates a circuit in which charge stored in a capacitor 109 is controlled by a transistor 108. Leakage current between electrodes of the capacitor 109 is ignored here. The capacitance of the capacitor 109 is 1 fF, the potential of the capacitor 109 on the transistor 108 side is +1 V, and the potential of $V_d$ is 0 V.

The curve 106 in FIG. 3A denotes the $I_d$-$V_g$ characteristics of the transistor 108. When the channel width is 0.1 μm, the Icut is approximately 1 fA and the resistivity of the transistor 108 at this time is approximately $1 \times 10^{15}$ Ω. Accordingly, the time constant of a circuit composed of the transistor 108 and the capacitor 109 is approximately one second. This means that most of the charge stored in the capacitor 109 is lost in approximately one second.

A curve 107 in FIG. 3A denotes the $I_d$-$V_g$ characteristics of the transistor 108. When the channel width is 0.1 μm, the Icut is approximately 1 yA and the resistivity of the transistor 108 at this time is approximately $1 \times 10^{24}$ Ω. Accordingly, the time constant of the circuit composed of the transistor 108 and the capacitor 109 is approximately $1 \times 10^9$ seconds (=approximately 31 years). This means that one-third of the charge stored in the capacitor 109 is left after 10 years.

From this, charge can be held for 10 years in a simple circuit composed of a transistor and a capacitor without applying such a large voltage. This can be applied to various kinds of memory devices. Electronic circuits, semiconductor devices, electronic devices, and the like, which utilize such characteristics, will be described in another embodiment.

The rate of increase in the threshold value depends on the density of charge trapped in the charge trap layer 102. For example, in the case where electrons are trapped only at an interface between the first insulating film 102a and the insulating film 102b containing silicon and nitrogen in the semiconductor device illustrated in FIG. 1B, the threshold value is increased by Q/C, where Q represents the area density of the trapped electrons and C represents the dielectric constant of the first insulating film 102a.

Note that the amount of trapped charges can be adjusted to constant by the potential of the gate electrode 103 as described. That is, the rate of increase in the threshold value can also be adjusted by the potential of the gate electrode 103.

For example, the potential of the gate electrode 103 is higher than those of the source electrode and the drain electrode by 1.5 V, and the temperature is set to be higher than or equal to 150° C. and lower than or equal to 250° C., typically 200° C.±20° C. In the case where the threshold value (a first threshold value $V_{th1}$) of a semiconductor device in a state before an electron is trapped in the charge trap layer 102 is +1.1 V, a channel is initially formed in the semiconductor layer 101, and electrons are trapped in the charge trap layer 102. Then, the number of electrons trapped in the charge trap layer 102 is increased, and the channel disappears. At this stage, trapping of electrons in the charge trap layer 102 is not conducted.

In this case, the channel disappears at the stage where the potential of the gate electrode 103 is higher than those of the source electrode and the drain electrode by 1.5 V; the threshold value is +1.5 V. In other words, the threshold value is increased by 0.4 V owing to the electrons trapped in the charge trap layer 102. The threshold value changed by the electrons trapped in the charge trap layer 102 in the above manner is referred to as a second threshold value ($V_{th2}$).

With use of the above characteristics, the threshold values of a plurality of semiconductor devices which considerably vary can fall within an appropriate range. For example, three semiconductor devices with first threshold values of +1.2 V, +1.1 V, and +0.9 V are provided. The semiconductor devices are treated under the above conditions, whereby trapping electrons which makes the threshold values of the semiconductor devices exceed +1.5 V is not caused; thus, the second threshold values of the three semiconductor devices can be each +1.5 V. In this case, the number of electrons trapped (or the area density of electrons, or the like) in the charge trap layer 102 differs between the three semiconductor devices.

The number of electrons trapped in the charge trap layer 102 depends on the treatment time of compensating the threshold value. Accordingly, the treatment time of compensating the threshold value is adjusted, whereby the threshold value can be shifted to the determined value.

The gate electrode 103 can be formed using any kind of materials. For example, a conductive film formed using Al, Ti, Cr, Co, Ni, Cu, Y, Zr, Mo, Ru, Ag, Ta, W, or the like can be used. The gate electrode 103 may be a stacked layer of any of the above materials. Alternatively, a conductive film containing nitrogen may be used for the gate electrode 103. For example, as the gate electrode 103, a stacked layer in which a titanium nitride film and a tungsten film are stacked in this order, a stacked layer in which a tungsten nitride film and a tungsten film are stacked in this order, a stacked layer in which a tantalum nitride film and a tungsten film are stacked in this order, or the like can be used.

The work function of the gate electrode 103 facing the semiconductor layer 101 is a factor in determining the threshold value of the semiconductor device. In general, the use of a material with a low work function causes a small threshold value. However, the threshold value can be adjusted by the amount of charges trapped in the charge trap layer 102 as described above, and thus the range of choices of materials used for the gate electrode 103 is expanded.

The semiconductor layer 101 can be formed using any kind of materials. For example, an oxide semiconductor film can be used. Alternatively, the use of p-type silicon is effective in trapping holes in the charge trap layer because that p-type silicon facilitates conduction of holes to the semiconductor layer 101.

The first insulating film 102a can be formed using any kind of materials. For example, an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

A silicon nitride film can be used for the insulating film 102b containing silicon and nitrogen, for example. The silicon nitride film can be formed by, for example, a chemical vapor deposition (CVD) method, a sputtering method, or the like. Alternatively, the silicon nitride film may be formed by stacking films deposited by different methods. For example, after a film is deposited by a CVD method, a film deposited by a sputtering method may be stacked to form a stacked structure. Further alternatively, after a film is deposited by a sputtering method, a film deposited by a CVD method may be stacked. Further alternatively, a film deposited by either a CVD method or a sputtering method is sandwiched between films deposited by the other method.

The second insulating film 102c can be formed using any kind of materials. For example, an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

The semiconductor device in which the necessary amount of charges is trapped in the charge trap layer 102 as described above is equivalent to a general MOS-type semiconductor device except that the threshold voltage has a specific value. The treatment in which charge is trapped in the charge trap layer 102 may be performed in a process of manufacturing the semiconductor device.

Figure 4A:
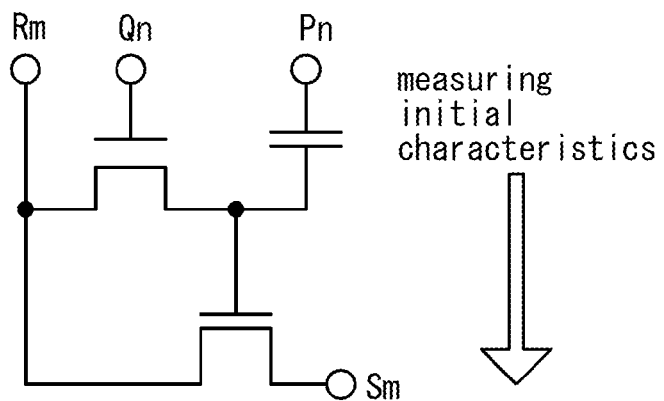
FIGS. 4A to 4C illustrate a manufacturing process of a semiconductor device.
Figure 4B:
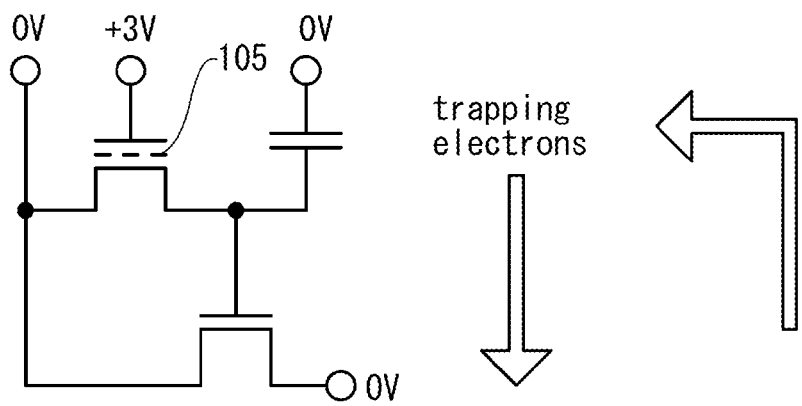
Figure 4C:
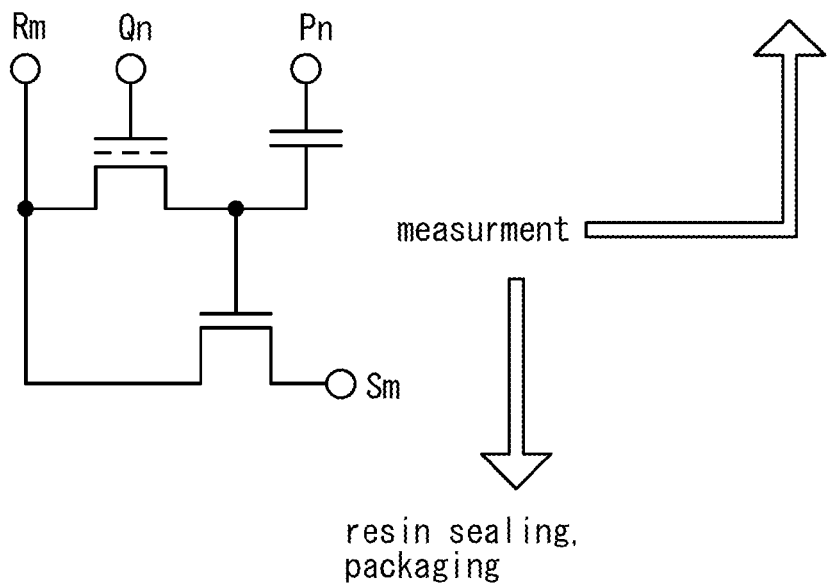

For example, a process shown in FIGS. 4A to 4C can be performed. First, as illustrated in FIG. 4A, initial characteristics are measured after a semiconductor device is completed, so that a conforming item is selected. Here, items without malfunctions that cannot be recovered due to a break in a wire or the like are regarded as conforming items. Since the threshold value has not been compensated yet, the charge in a capacitor cannot be held for a long time, and the threshold values vary. However, this is not the criteria of selection.

Then, the electron 105 is injected as illustrated in FIG. 4B. In other words, the appropriate number of electrons 105 is trapped in the insulating film 102b containing silicon and nitrogen. This action is performed in the above-described manner. At this time, the difference between the potential of the gate electrode 103 and the potential of the one with the lower potential of the source electrode and the drain electrode is higher than or equal to 1 V and lower than 4 V. In addition, the difference is lower than or equal to the gate voltage that is applied to this memory cell after this memory cell is shipped.

After that, measurement is performed again as illustrated in FIG. 4C. One of the criteria for conforming items is that the threshold value is increased as planned. At this stage, a chip with an abnormal threshold value is regarded as a nonconforming item, and electron injection may be performed again in this chip. The conforming item is subjected to dicing, resin sealing, packaging, and then shipped.

Note that the timing of a step of injecting electrons into the charge trap layer 102 is not limited to the above. The step may be performed at any of time before leaving the factory, for example, a step after formation of a wiring metal connected to the source electrode or the drain electrode of the semiconductor device, a step after the preceding process (wafer treatment), a step after the wafer-dicing step, a step after packaging, or the like. In any case, it is preferable that the transistor be not exposed to a temperature higher than or equal to 125° C. for an hour or more after the step of injecting electrons.

Although an example in which the threshold value is shifted in the positive direction by trapping electrons in the charge trap layer is described in this example, the threshold value may be shifted in the negative direction by trapping holes. In this example, the potential of the gate electrode that is lower than that of the source electrode or the drain electrode is held for a second or more at a temperature higher than or equal to 125° C. and lower than or equal to 450° C., whereby holes are trapped.

This embodiment can be combined with any of the other embodiments in this specification as appropriate.

Embodiment 2

In this embodiment, a semiconductor device which is one embodiment of the present invention will be described with reference to drawings.

Figure 5A:
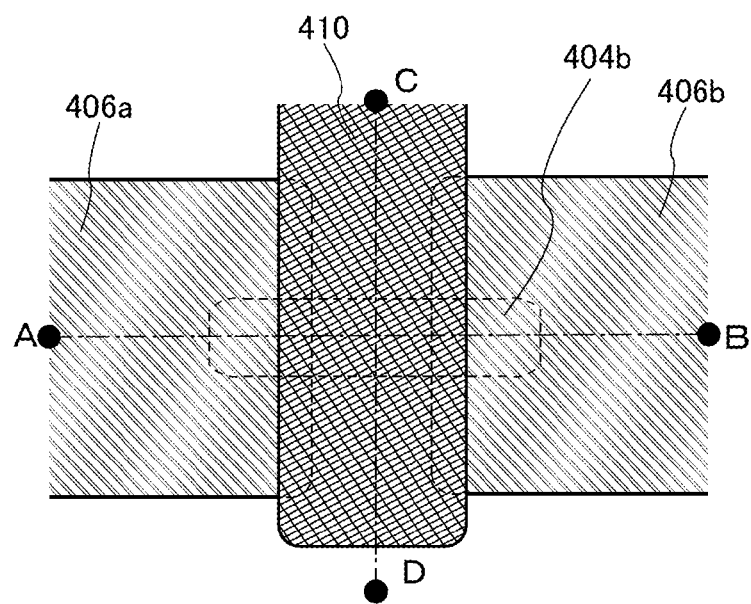
FIGS. 5A to 5C are a top view and cross-sectional views which illustrate a transistor.
Figure 5B:
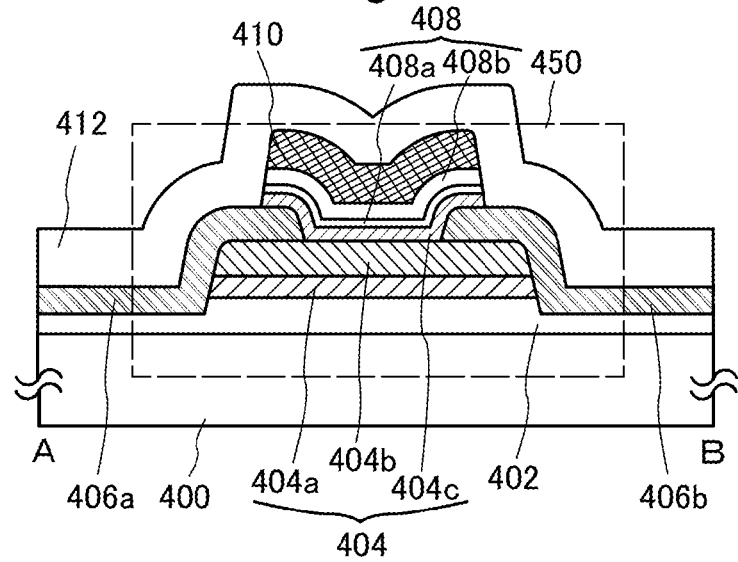
Figure 5C:
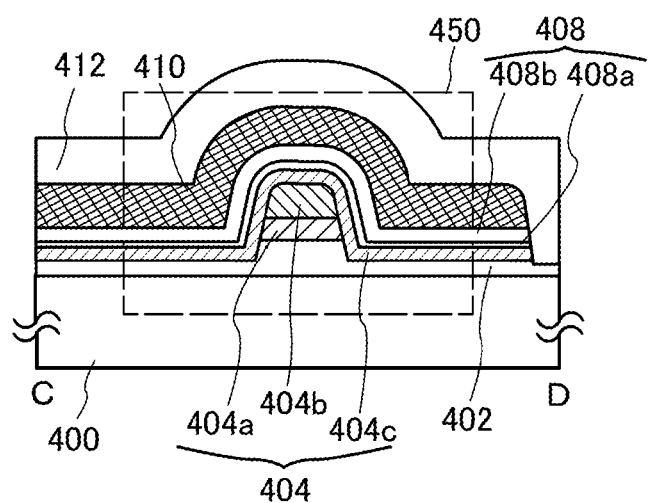

FIGS. 5A to 5C are a top view and cross-sectional views which illustrate a transistor of one embodiment of the present invention. FIG. 5A is the top view. FIG. 5B illustrates a cross section taken along the dashed-dotted line A-B in FIG. 5A. FIG. 5C illustrates a cross section taken along the dashed-dotted line C-D in FIG. 5A. Note that for simplification of the drawing, some components are not illustrated in the top view of FIG. 5A. In some cases, the direction of the dashed-dotted line A-B is referred to as a channel length direction, and the direction of the dashed-dotted line C-D is referred to as a channel width direction.

A transistor 450 illustrated in FIGS. 5A to 5C includes the following components: a base insulating film 402 having a depressed portion and a projected portion over a substrate 400; an oxide semiconductor film 404a and an oxide semiconductor film 404b over the projected portion of the base insulating film 402; a source electrode 406a and a drain electrode 406b over the oxide semiconductor film 404a and the oxide semiconductor film 404b; an oxide semiconductor film 404c that is in contact with a bottom surface of the depressed portion of the base insulating film 402, side surface of the projected portion (or the depressed portion) of the base insulating film 402, side surfaces of the oxide semiconductor film 404a, top surfaces and side surfaces of the oxide semiconductor film 404b, the source electrode 406a, and the drain electrode 406b; a gate insulating film 408 over the oxide semiconductor film 404c; a gate electrode 410 that is over and in contact with the gate insulating film 408 and faces the top surface and the side surfaces of the oxide semiconductor film 404b; and an oxide insulating film 412 over the source electrode 406a, the drain electrode 406b, and the gate electrode 410. Note that the gate insulating film 408 includes a first insulating film 408a and a trap film 408b and functions as a charge trap layer described in Embodiment 1. Furthermore, the oxide semiconductor film 404a, the oxide semiconductor film 404b, and the oxide semiconductor film 404c are collectively referred to as a multilayer film 404.

Note that the channel length indicates a distance between a source (source region or source electrode) and a drain (drain region or drain electrode) in a region where the semiconductor film and the gate electrode overlap with each other when seen in the top view. In other words, the channel length seen in FIG. 5A indicates a distance between the source electrode 406a and the drain electrode 406b in a region where the oxide semiconductor film 404b and the gate electrode 410 overlap with each other. The channel width indicates a length of a portion of the source or the drain that faces the drain or the source in the region where the semiconductor film and the gate electrode overlap with each other. In other words, the channel width seen in FIG. 5A indicates the length of a portion of the source electrode 406a or the drain electrode 406b that faces the drain electrode 406b or the source electrode 406a in the region where the oxide semiconductor film 404b and the gate electrode 410 overlap with each other.

The gate insulating film 408 (the first insulating film 408a and the trap film 408b) functions as a charge trap layer, whereby charge can be trapped in the charge trap state existing in an interface between the first insulating film 408a and the trap film 408b or inside the trap film 408b as described in Embodiment 1. At this time, the amount of charges trapped in the charge trap state can be adjusted by the potential of the gate electrode 410.

The amount of trapped charges can be adjusted to constant by the potential of the gate electrode 410, and thus the rate of increase in the threshold value can be controlled.

The gate electrode 410 electrically covers the oxide semiconductor film 404b when seen in a channel width direction, so that the on-state current is increased. Such a transistor structure is referred to as a surrounded channel (s-channel) structure. In the s-channel structure, current flows through the whole oxide semiconductor film 404b (bulk). Since the current flows through the inside of the oxide semiconductor film 404b, an adverse effect of interface scattering is unlikely to occur, leading to a large amount of on-state current. Note that an increase in the thickness of the oxide semiconductor film 404b enables the on-state current to increase. Thus, even when the gate electrode 410 extends (toward the base insulating film 402 side) to a portion lower than the interface between the oxide semiconductor film 404a and the oxide semiconductor film 404b, the channel width is not affected by such a structure, and the channel width can be made small. Thus, the high density (high integration) is achieved.

When the channel length and the channel width of a transistor are shortened, an electrode, a semiconductor film, or the like has a round upper end portion (curved surface) in some cases by processing the electrode, the semiconductor film, or the like while a resist mask is made to recede. With this structure, the coverage with the gate insulating film 408, the gate electrode 410, and the oxide insulating film 412, which are to be formed over the oxide semiconductor film 404b, can be improved. In addition, electric field concentration which might occur at end portions of the source electrode 406a and the drain electrode 406b can be reduced, which can suppress deterioration of the transistor.

Furthermore, miniaturization of the transistor enables an increase in integration, which leads to high density. For example, the channel length of the transistor is less than or equal to 100 nm, preferably less than or equal to 40 nm, further preferably less than or equal to 30 nm, still further preferably less than or equal to 20 nm and the channel width of the transistor is preferably less than or equal to 100 nm, preferably less than or equal to 40 nm, further preferably less than or equal to 30 nm, still further preferably less than or equal to 20 nm. According to one embodiment, a transistor even with a narrow channel makes it possible to increase the amount of on-state current when an s-channel structure is employed.

The substrate 400 is not limited to a simple supporting substrate, and may be a substrate where a device such as a transistor is formed. In that case, at least one of the gate electrode 410, the source electrode 406a, and the drain electrode 406b of the transistor 450 may be electrically connected to the above device.

The base insulating film 402 can have a function of supplying oxygen to the multilayer film 404 as well as a function of preventing diffusion of impurities from the substrate 400. For this reason, the base insulating film 402 is preferably an insulating film containing oxygen and further preferably an insulating film containing oxygen in excess of the stoichiometric composition. In the case where the substrate 400 is provided with another device as described above, the base insulating film 402 also functions as an interlayer insulating film. In that case, since the base insulating film 402 has an uneven surface, the base insulating film 402 is preferably subjected to planarization treatment such as chemical mechanical polishing (CMP) treatment so as to have a flat surface.

The multilayer film 404 in which a channel of the transistor 450 is formed has a structure in which the oxide semiconductor film 404a, the oxide semiconductor film 404b, and the oxide semiconductor film 404c are stacked in this order from the substrate 400 side. The oxide semiconductor film 404b is surrounded by the oxide semiconductor film 404a and the oxide semiconductor film 404c. As in FIG. 5C, the gate electrode 410 electrically covers the oxide semiconductor film 404b.

Here, for the oxide semiconductor film 404b, for example, an oxide semiconductor whose electron affinity (an energy difference between a vacuum level and the conduction band minimum) is higher than those of the oxide semiconductor film 404a and the oxide semiconductor film 404c is used. The electron affinity can be obtained by subtracting an energy difference between a bottom of a conduction band and a top of a valence band (what is called an energy gap) from an energy difference between the vacuum level and the top of the valence band (what is called an ionization potential).

It is preferable that each of the oxide semiconductor film 404a and the oxide semiconductor film 404c contains one or more kinds of metal elements forming the oxide semiconductor film 404b, and is formed using an oxide semiconductor whose energy of the bottom of the conduction band is closer to the vacuum level than that of the oxide semiconductor film 404b is by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor film 404b whose conduction band minimum is the lowest in the multilayer film 404. In other words, the oxide semiconductor film 404c is formed between the oxide semiconductor film 404b and the gate insulating film 408, whereby the channel of the transistor is formed in a region that is not in contact with the gate insulating film 408.

Further, since the oxide semiconductor film 404a contains one or more metal elements contained in the oxide semiconductor film 404b, an interface state is less likely to be formed at the interface of the oxide semiconductor film 404b with the oxide semiconductor film 404a than at the interface with the base insulating film 402 on the assumption that the oxide semiconductor film 404b is in contact with the base insulating film 402. The interface state sometimes forms a channel; therefore, the threshold value of the transistor is changed in some cases. Thus, with the oxide semiconductor film 404a, fluctuations in electrical characteristics of the transistors, such as a threshold value, can be reduced. Further, the reliability of the transistor can be improved.

Furthermore, since the oxide semiconductor film 404c contains one or more metal elements contained in the oxide semiconductor film 404b, scattering of carriers is less likely to occur at the interface of the oxide semiconductor film 404b with the oxide semiconductor film 404c than at the interface with the gate insulating film 408 on the assumption that the oxide semiconductor film 404b is in contact with the gate insulating film 408. Therefore, with the oxide semiconductor film 404c, the field-effect mobility of the transistor can be increased.

For the oxide semiconductor film 404a and the oxide semiconductor film 404c, for example, a material containing Al, Ti, Ga, Ge, Y, Zr, Sn, La, Ce, or Hf with a higher atomic ratio than that used for the oxide semiconductor film 404b can be used. Specifically, any of the above metal elements in an atomic ratio 1.5 times or more, preferably 2 times or more, further preferably 3 times or more as much as a metal element of the oxide semiconductor film 404b is contained. Any of the above metal elements is strongly bonded to oxygen and thus has a function of suppressing generation of an oxygen vacancy. That is, an oxygen vacancy is less likely to be generated in the oxide semiconductor film 404a and the oxide semiconductor film 404c than in the oxide semiconductor film 404b.

Note that when each of the oxide semiconductor film 404a, the oxide semiconductor film 404b, and the oxide semiconductor film 404c is an In-M-Zn oxide containing at least indium, zinc, and M (M is a metal such as Al, Ti, Ga, Ge, Y, Zr, Sn, La, Ce, or Hf), and the oxide semiconductor film 404a has an atomic ratio of In to M and Zn which is $x_1:y_1:z_1$, the oxide semiconductor film 404b has an atomic ratio of In to M and Zn which is $x_2:y_2:z_2$, and the oxide semiconductor film 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably twice or more as large as $y_2/x_2$, further preferably 3 times or more as large as $y_2/x_2$. At this time, when $y_2$ is greater than or equal to $x_2$ in the oxide semiconductor film 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

In each of the oxide semiconductor film 404a and the oxide semiconductor film 404c, the proportions of In and M when summation of In and M is assumed to be 100 atomic % are as follows: the atomic percentage of In is less than 50 atomic % and the atomic percentage of M is greater than or equal to 50 atomic %; or the atomic percentage of In is less than 25 atomic % and the atomic percentage of M is greater than or equal to 75 atomic %. In the oxide semiconductor film 404b, the proportions of In and M when summation of In and M is assumed to be 100 atomic % are preferably as follows: the atomic percentage of In is greater than or equal to 25 atomic % and the atomic percentage of M is less than 75 atomic %, or the atomic percentage of In is greater than or equal to 34 atomic % and the atomic percentage of M is less than 66 atomic %.

The thicknesses of the oxide semiconductor film 404a and the oxide semiconductor film 404c are each greater than or equal to 3 nm and less than or equal to 100 nm, preferably greater than or equal to 3 nm and less than or equal to 50 nm. The thickness of the oxide semiconductor film 404b is greater than or equal to 3 nm and less than or equal to 200 nm, preferably greater than or equal to 3 nm and less than or equal to 100 nm, further preferably greater than or equal to 3 nm and less than or equal to 50 nm. The thickness of the oxide semiconductor film 404b is preferably larger than those of the oxide semiconductor film 404a and the oxide semiconductor film 404c.

For each of the oxide semiconductor film 404a, the oxide semiconductor film 404b, and the oxide semiconductor film 404c, an oxide semiconductor containing indium, zinc, and gallium can be used, for example. Note that the oxide semiconductor film 404b preferably contains indium because carrier mobility can be increased.

Note that stable electrical characteristics can be effectively imparted to a transistor including an oxide semiconductor by reducing the concentration of impurities in the oxide semiconductor film to make the oxide semiconductor film intrinsic or substantially intrinsic. The term "substantially intrinsic" refers to the state where an oxide semiconductor film has a carrier density lower than $1 \times 10^{17}/cm^3$, preferably lower than $1 \times 10^{15}/cm^3$, further preferably lower than $1 \times 10^{13}/cm^3$.

Further, in the oxide semiconductor film, hydrogen, nitrogen, carbon, silicon, and a metal element other than main components are impurities. For example, hydrogen and nitrogen form donor levels to increase the carrier density, and silicon forms impurity levels (states) in the oxide semiconductor film. The impurity level (state) becomes a trap, which might deteriorate the electric characteristics of the transistor. Accordingly, in the oxide semiconductor film 404a, the oxide semiconductor film 404b, and the oxide semiconductor film 404c and at interfaces between these films, the impurity concentration is preferably reduced.

In order to make the oxide semiconductor film intrinsic or substantially intrinsic, the concentration of silicon at a certain depth of the oxide semiconductor film or in a region of the oxide semiconductor film, which is measured by secondary ion mass spectrometry (SIMS), is set to be lower than $1 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$. Further, the concentration of hydrogen at a certain depth of the oxide semiconductor film or in a region of the oxide semiconductor film is preferably lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$. Further, the concentration of nitrogen at a certain depth of the oxide semiconductor film or in a region of the oxide semiconductor film is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

In addition, in the case where the oxide semiconductor film includes a crystal, the crystallinity of the oxide semiconductor film might be lowered if silicon or carbon is contained at high concentration. In order not to lower the crystallinity of the oxide semiconductor film, for example, the concentration of silicon at a certain depth of the oxide semiconductor film or in a region of the oxide semiconductor film may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor film or in a region of the oxide semiconductor film may be lower than $1\times10^{19}$ atoms/cm$^3$, preferably lower than $5\times10^{18}$ atoms/cm$^3$, further preferably lower than $1\times10^{18}$ atoms/cm$^3$.

A transistor in which a highly purified oxide semiconductor film is used for a channel formation region as described above has extremely low off-state current. In the case where the voltage between a source and a drain is set to about 0.1 V, 5 V, or 10 V, for example, the off-state current normalized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the multilayer film, which serves as a channel, be not in contact with the gate insulating film for the above-described reason. In the case where a channel is formed at the interface between the gate insulating film and the multilayer film, scattering of carriers occurs at the interface, whereby the field-effect mobility of the transistor is reduced in some cases. Also from the view of the above, it is preferable that the region of the multilayer film, which serves as a channel, be separated from the gate insulating film.

Accordingly, with the multilayer film 404 having a stacked structure including the oxide semiconductor film 404a, the oxide semiconductor film 404b, and the oxide semiconductor film 404c in this order, a channel can be formed in the oxide semiconductor film 404b; thus, the transistor can have a high field-effect mobility and stable electric characteristics.

Next, the band structure of the multilayer film 404 is described. For analyzing the band structure, a stacked film corresponding to the multilayer film 404 is formed. In the stacked film, In—Ga—Zn oxide with an energy gap of 3.5 eV is used for layers corresponding to the oxide semiconductor film 404a and the oxide semiconductor film 404c, and In—Ga—Zn oxide with an energy gap of 3.15 eV is used for a layer corresponding to the oxide semiconductor film 404b.

The energy gaps of the oxide semiconductor film 404a, the oxide semiconductor film 404b, and the oxide semiconductor film 404c were measured with the use of a spectroscopic ellipsometer (UT-300 manufactured by HORIBA Jobin Yvon) under the condition where the thickness of each of the film was set to 10 nm. The energy difference between the vacuum level and the top of the valence band was measured using an ultraviolet photoelectron spectroscopy (UPS) device (VersaProbe, ULVAC-PHI, Inc.).

Figure 6A:
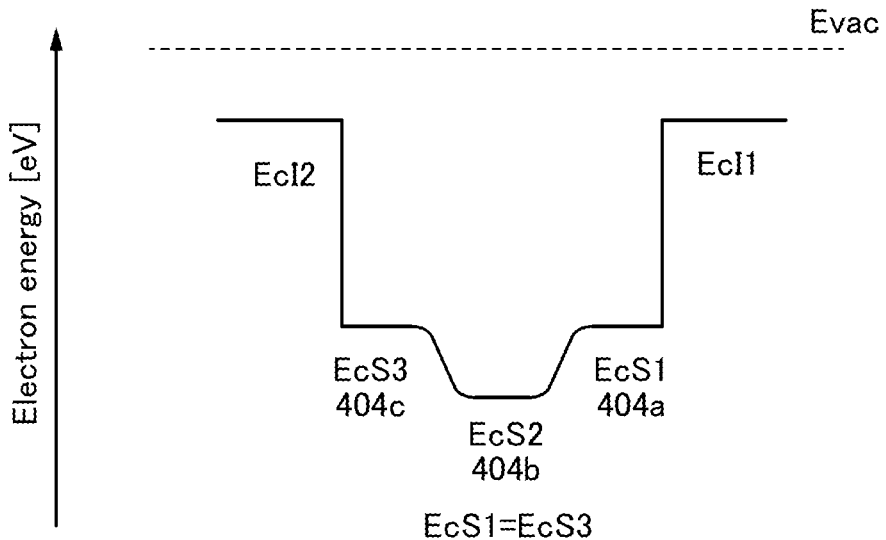
FIGS. 6A and 6B show band structures of multilayer films.

FIG. 6A schematically shows part of a band structure of an energy gap (electron affinity) between the vacuum level and the bottom of the conduction band of each layer, which is calculated by subtracting the energy gap of each layer from the energy gap between the vacuum level and the top of the valence band. FIG. 6A is a band diagram showing the case where silicon oxide films are provided in contact with the oxide semiconductor film 404a and the oxide semiconductor film 404c. Here, Evac represents energy of the vacuum level, EcI1 and EcI2 each represent energy at the bottom of conduction band of the silicon oxide film, EcS1 represents energy at the bottom of the conduction band of the oxide semiconductor film 404a, EcS2 represents energy at the bottom of the conduction band of the oxide semiconductor film 404b, and EcS3 represents energy at the bottom of the conduction band of the oxide semiconductor film 404c.

As shown in FIG. 6A, the energies at the bottoms of conduction bands of the oxide semiconductor film 404a, the oxide semiconductor film 404b, and the oxide semiconductor film 404c successively vary. This can be understood also from the fact that the compositions of the oxide semiconductor film 404a, the oxide semiconductor film 404b, and the oxide semiconductor film 404c are close to one another and oxygen is easily diffused among the films. Thus, the oxide semiconductor film 404a, the oxide semiconductor film 404b, and the oxide semiconductor film 404c have a continuous physical property although they have different compositions and form a stack.

The layers of the multilayer film 404, which contain the same main components and are stacked, are not simply stacked but formed to have continuous junction (here, particularly a U-shaped well structure where the energy of the bottom of the conduction band is continuously changed between the layers). In other words, the stacked-layer structure is formed so that an impurity which forms a defect state serving as a trap center or a recombination center does not exist at interfaces between the layers. If impurities exist between the stacked layers in the multilayer film, the continuity of the energy band is lost and carriers disappear by a trap or recombination.

Note that FIG. 6A shows the case where EcS1 and EcS3 are equal to each other; however, EcS1 and EcS3 may be different from each other. For example, part of the band structure in the case where EcS1 is higher than EcS3 is shown in FIG. 6B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor film 404a and the oxide semiconductor film 404c and an In—Ga—Zn oxide whose atomic ratio of In to Ga and Zn is 1:1:1 or 3:1:2 can be used for the oxide semiconductor film 404b. Further, when EcS1 is higher than EcS3, an In—Ga—Zn oxide whose atomic ratio of In to Ga and Zn is 1:6:4 or 1:9:6 can be used for the oxide semiconductor film 404a, an In—Ga—Zn oxide whose atomic ratio of In to Ga and Zn is 1:1:1 or 3:1:2 can be used for the oxide semiconductor film 404b, and an In—Ga—Zn oxide whose atomic ratio of In to Ga and Zn is 1:3:2, 1:3:3, or 1:3:4 can be used for the oxide semiconductor film 404c, for example.

Figure 6B:
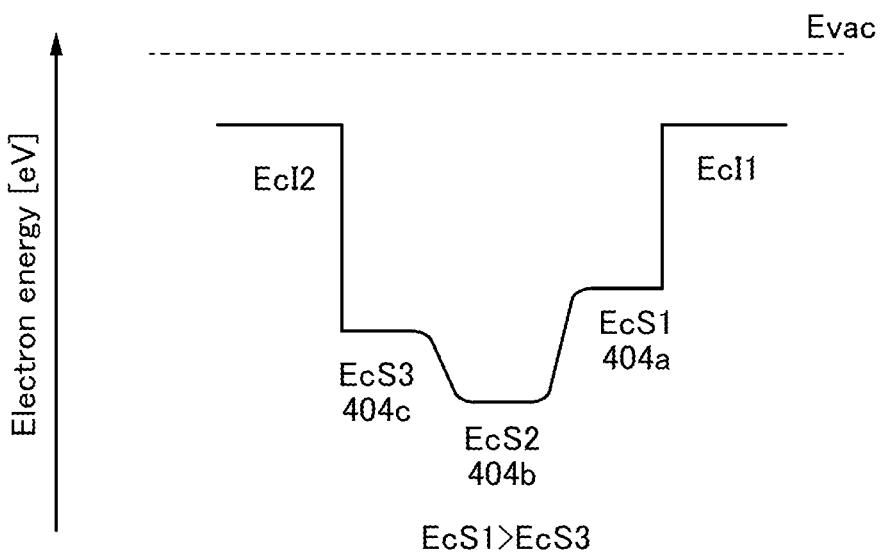

According to FIGS. 6A and 6B, the oxide semiconductor film 404b of the multilayer film 404 serves as a well, so that a channel is formed in the oxide semiconductor film 404b in a transistor including the multilayer film 404. Since the energy of the bottom of the conduction band is continuously changed, the multilayer film 404 can also be referred to as a U-shaped well. Further, a channel formed to have such a structure can also be referred to as a buried channel.

Note that trap states resulting from impurities or defects can be formed in the vicinity of the interfaces between the oxide semiconductor film 404a and an insulating film such as the silicon oxide film and between the oxide semiconductor film 404c and such an insulating film. The oxide semiconductor film 404b can be distanced away from the trap state owing to existence of the oxide semiconductor film 404a and the oxide semiconductor film 404c. However, in the case where the energy difference between EcS1 and EcS2 or between EcS3 and EcS2 is small, an electron in the oxide semiconductor film 404b might reach the trap state across the energy difference. The electron is trapped by the trap state to be negative charge, whereby the threshold value shifts in the positive direction.

Thus, to reduce fluctuations in the threshold values of the transistor, energy differences of at least certain values between EcS2 and EcS1 and between EcS2 and EcS3 are necessary. Each of the energy differences is preferably greater than or equal to 0.1 eV, further preferably greater than or equal to 0.15 eV.

The oxide semiconductor film 404a, the oxide semiconductor film 404b, and the oxide semiconductor film 404c preferably include crystal parts. In particular, when a crystal in which c-axes are aligned is used, the transistor can have stable electrical characteristics.

In the case where an In—Ga—Zn oxide is used for the multilayer film 404, it is preferable that the oxide semiconductor film 404c contain less In than the oxide semiconductor film 404b so that diffusion of In to the gate insulating film is prevented.

For the source electrode 406a and the drain electrode 406b, a conductive material which is easily bonded to oxygen is preferably used. For example, Al, Cr, Cu, Ta, Ti, Mo, or W can be used. Among the materials, in particular, it is preferable to use Ti which is easily bonded to oxygen or W with a high melting point, which allows subsequent process temperatures to be relatively high. Note that the conductive material which is easily bonded to oxygen includes, in its category, a material to which oxygen is easily diffused.

When the conductive material which is easily bonded to oxygen is in contact with a multilayer film, a phenomenon occurs in which oxygen in the multilayer film is diffused to the conductive material which is easily bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer film and is in contact with the source electrode or the drain electrode. By binding hydrogen slightly contained in the film to the oxygen vacancy, the region becomes an n-type region. Thus, the n-type region can serve as a source region or a drain region of the transistor.

In the case of forming a transistor with an extremely short channel length, an n-type region which is formed by the generation of oxygen vacancies sometimes extends in the channel length direction of the transistor, which might causes short circuit. In that case, as for electrical characteristics of the transistor, a shift of the threshold value occurs, and on/off of the transistor cannot be controlled with the gate voltage (i.e., the transistor is on). Accordingly, when a transistor with an extremely short channel length is formed, it is not always preferable that a conductive material easily bonded to oxygen be used for a source electrode and a drain electrode.

In such a case, a conductive material which is less likely to be bonded to oxygen than the above material is preferably used for the source electrode 406a and the drain electrode 406b. As the conductive material, for example, a material containing tantalum nitride, titanium nitride, or ruthenium or the like can be used. Note that the conductive material may be in contact with the oxide semiconductor film 404b. In that case, the conductive material and the above-mentioned conductive material easily bonded to oxygen may be stacked.

The gate insulating film 408 includes the first insulating film 408a and the trap film 408b. As the first insulating film 408a, an oxide insulating film may be used, for example. The oxide insulating film can be formed using an insulating film containing one or more of magnesium oxide, silicon oxide, silicon oxynitride, silicon nitride oxide, gallium oxide, germanium oxide, yttrium oxide, zirconium oxide, lanthanum oxide, neodymium oxide, and tantalum oxide. As the trap film 408b, an insulating film containing silicon and nitrogen is used. Examples of the insulating film containing silicon and nitrogen include a silicon nitride film and a silicon nitride oxide film. The silicon nitride oxide film refers to a film containing more nitrogen than oxygen. Here, an example of using a silicon nitride is described. The silicon nitride film can be formed by, for example, a CVD method (including a MOCVD method, an ALD method, or a PECVD method), a sputtering method, an MBE method, a PLD method, or the like. Alternatively, the insulating film containing silicon and nitrogen may be formed by stacking films formed by different methods. For example, a film is formed by a CVD method, and then a film formed by a sputtering method may be stacked thereover. Alternatively, a film is formed by a sputtering method, and then a film formed by a CVD method may be stacked thereover. Further alternatively, a film formed by either a CVD method or a sputtering method may be sandwiched between films formed by the other method. Note that the thickness of the first insulating film 408a is greater than or equal to 1 nm and less than or equal to 30 nm, preferably greater than or equal to 3 nm and less than or equal to 10 nm, and the thickness of the trap film 408b is greater than or equal to 1 nm and less than or equal to 30 nm, preferably greater than or equal to 5 nm and less than or equal to 20 nm.

Figure 7A:
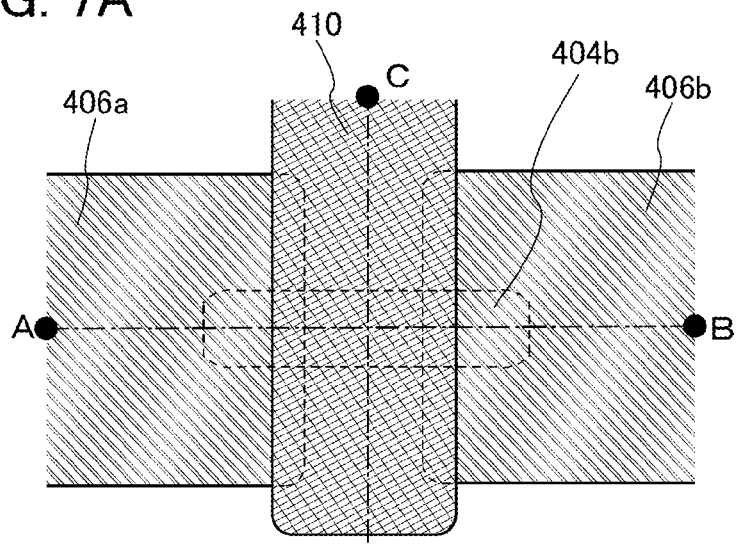
FIGS. 7A to 7C are a top view and cross-sectional views which illustrate a transistor.
Figure 7B:
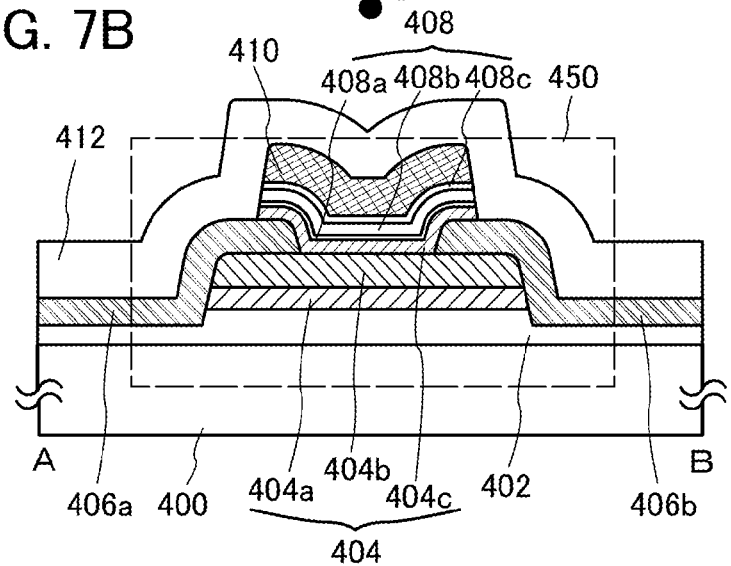
Figure 7C:
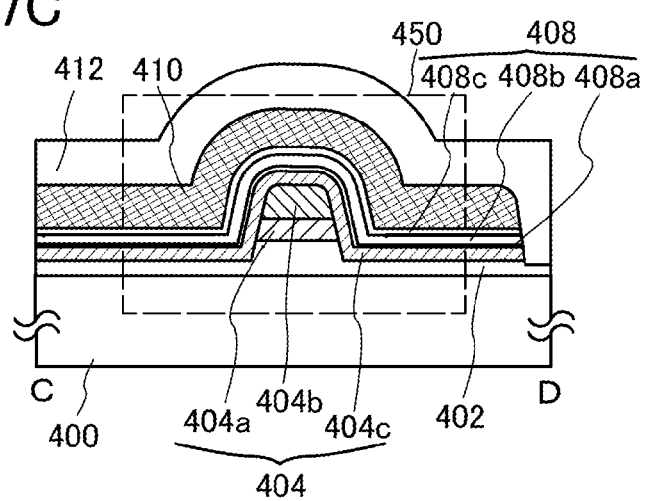

As illustrated in FIGS. 7A to 7C, a second insulating film 408c may be formed over the trap film 408b. The second insulating film 408c can be formed using any kind of materials. For example, the second insulating film 408c can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide.

For the gate electrode 410, a conductive film formed using Al, Ti, Cr, Co, Ni, Cu, Y, Zr, Mo, Ru, Ag, Ta, W, or the like can be used. The gate electrode 410 may be a stack of any of the above materials. Alternatively, a conductive film containing nitrogen may be used for the gate electrode 410. For example, for the gate electrode 410, a stacked layer in which a titanium nitride film and a tungsten film are stacked in this order, a stacked layer in which a tungsten nitride film and a tungsten film are stacked in this order, a stacked layer in which a tantalum nitride film and a tungsten film are stacked in this order can be used.

The oxide insulating film 412 may be formed over the gate insulating film 408 and the gate electrode 410. The oxide insulating film can be formed using an insulating film containing one or more of magnesium oxide, silicon oxide, silicon oxynitride, silicon nitride oxide, gallium oxide, germanium oxide, yttrium oxide, zirconium oxide, lanthanum oxide, neodymium oxide, and tantalum oxide. The oxide insulating film may be a stack of any of the above materials.

Here, the oxide insulating film 412 preferably contains excess oxygen. An oxide insulating film containing excess oxygen refers to an oxide insulating film from which oxygen can be released by heat treatment or the like. The oxide insulating film containing excess oxygen is preferably a film in which the amount of released oxygen when converted into oxygen atoms is $1.0 \times 10^{19}$ atoms/cm$^3$ or more in thermal desorption spectroscopy analysis performed such that the surface temperature is higher than or equal to 100° C. and lower than or equal to 700° C., preferably higher than or equal to 100° C. and lower than or equal to 500° C. Oxygen released from the oxide insulating film can be diffused to the channel formation region in the multilayer film 404 through the gate insulating film 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of the electrical characteristics of the transistor. In particular, a reduction in the amount of on-state current, which is directly caused by a decrease in channel width, is significant.

However, in the transistor of one embodiment of the present invention, as described above, the oxide semiconductor film 404c is formed so as to cover the channel formation region of the oxide semiconductor film 404b, and the channel formation layer and the gate insulating film are not in contact with each other. Accordingly, scattering of carriers at the interface between the channel formation layer and the gate insulating film can be reduced and the field-effect mobility of the transistor can be increased.

When the oxide semiconductor film is intrinsic or substantially intrinsic, a reduction of the field-effect mobility due to a decrease in the number of carries in the oxide semiconductor film is concerned. However, in the transistor of one embodiment of the present invention, a gate electric field is applied to the oxide semiconductor film not only in the vertical direction but also in the side surface directions. That is, the gate electric field is applied to the whole of the oxide semiconductor film, whereby current flows in the bulk of the oxide semiconductor film. Consequently, a change in the electrical characteristics can be suppressed owing to the highly purified intrinsic oxide semiconductor film and the field-effect mobility of the transistor can be increased.

In the transistor of one embodiment of the present invention, the oxide semiconductor film 404b is formed over the oxide semiconductor film 404a, so that an interface state is less likely to be formed. In addition, impurities do not enter the oxide semiconductor film 404b from above and below because the oxide semiconductor film 404b is an intermediate layer in a three-layer structure. With the structure in which the oxide semiconductor film 404b is surrounded by the oxide semiconductor film 404a and the oxide semiconductor film 404c (or the oxide semiconductor film 404b is electrically covered with the gate electrode 410), the amount of on-state current of the transistor is increased as described above, and in addition, the threshold value can be stabilized and an S value can be reduced. Thus, Icut can be reduced and power consumption can be reduced. Furthermore, the threshold value of the transistor becomes stable; thus, long-term reliability of the semiconductor device can be improved.

Figure 8A:
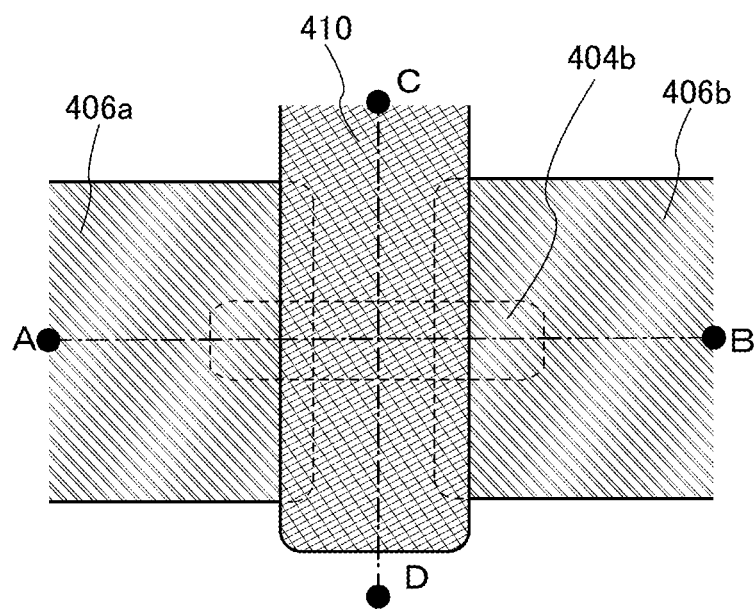
FIGS. 8A to 8C are a top view and cross-sectional views which illustrate a transistor.
Figure 8B:
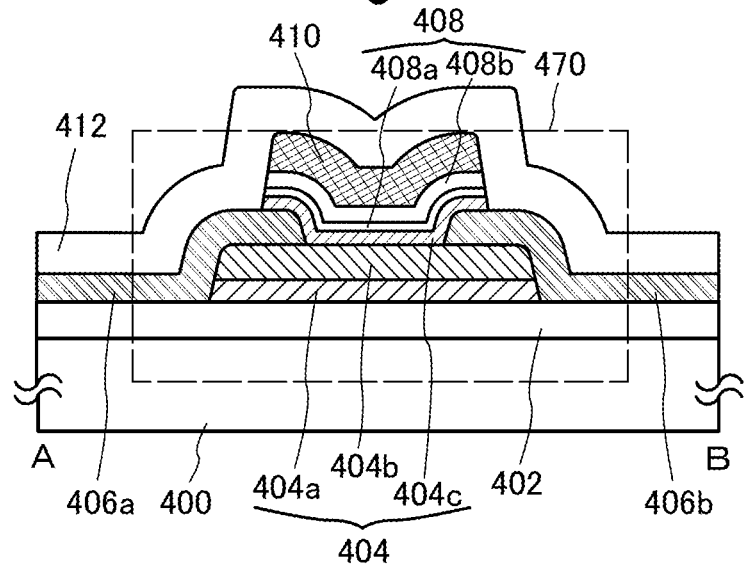
Figure 8C:
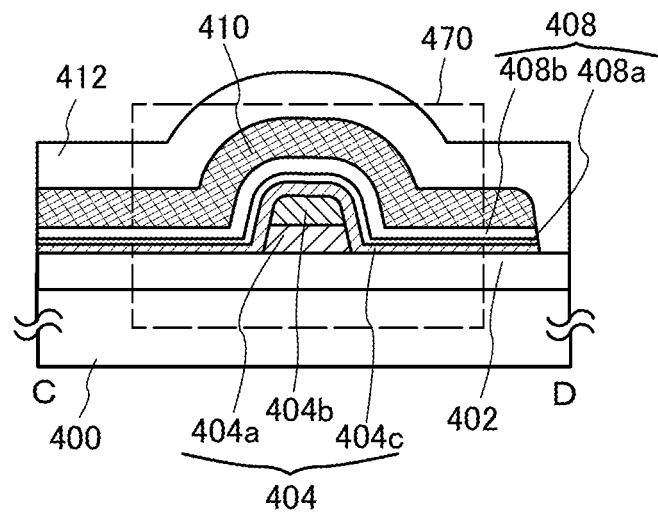

Moreover, a transistor 470 illustrated in FIGS. 8A to 8C can be employed. FIGS. 8A to 8C are a top view and cross-sectional views of the transistor 470. FIG. 8A is the top view. FIG. 8B illustrates a cross section taken along the dashed-dotted line A-B in FIG. 8A. FIG. 8C illustrates a cross section taken along the dashed-dotted line C-D in FIG. 8A. Note that for simplification of the drawing, some components in the top view in FIG. 8A are not illustrated.

In the transistor 470, the base insulating film 402 is not etched because a conductive film that is to be the source electrode 406a and the drain electrode 406b is not over-etched in a step of forming the source electrode 406a and the drain electrode 406b.

In order to prevent etching of the base insulating film 402 caused by over-etching of the conductive film, the etching selectivity of the conductive film to the base insulating film 402 is high.

Although in this embodiment, the oxide semiconductor film 404b is sandwiched between the oxide semiconductor film 404a and the oxide semiconductor film 404c, the oxide semiconductor film is not limited to this structure. A structure in which neither the oxide semiconductor film 404a nor the oxide semiconductor film 404c is provided and only the oxide semiconductor film 404b is electrically covered with the gate electrode may be employed.

This embodiment can be combined with any of the other embodiments in this specification as appropriate.

Embodiment 3

In this embodiment, a method for forming the transistor 450, which is described in Embodiment 2 with reference to FIGS. 5A to 5C, is described with reference to FIGS. 9A to 9C and FIGS. 10A to 10C.

Figure 9A:
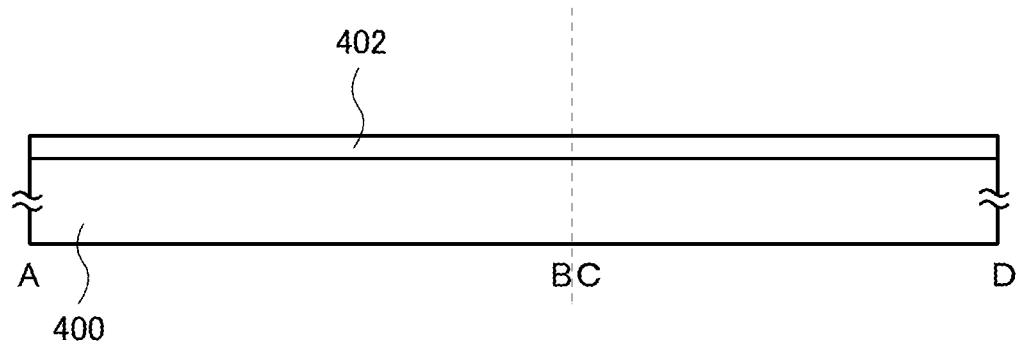
FIGS. 9A to 9C illustrate a method for manufacturing a transistor.

First, the base insulating film 402 is formed over the substrate 400 (see FIG. 9A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The base insulating film 402 can be formed by a plasma CVD method, a sputtering method, or the like using an oxide insulating film such as an aluminum oxide film, a magnesium oxide film, a silicon oxide film, a silicon oxynitride film, a gallium oxide film, a germanium oxide film, a yttrium oxide film, a zirconium oxide film, a lanthanum oxide film, a neodymium oxide film, a hafnium oxide film, or a tantalum oxide film, a nitride insulating film such as a silicon nitride film, a silicon nitride oxide film, an aluminum nitride film, or an aluminum nitride oxide film, or a film in which any of the above materials are mixed. Alternatively, a stack including any of the above materials may be used, and at least an upper layer of the base insulating film 402 which is in contact with the multilayer film 404 is preferably formed using a material containing excess oxygen that might serve as a supply source of oxygen to the multilayer film 404.

Oxygen may be added to the base insulating film 402 by an ion implantation method, an ion doping method, a plasma immersion ion implantation method, or the like. Adding oxygen enables the base insulating film 402 to supply oxygen much easily to the multilayer film 404.

In the case where a surface of the substrate 400 is made of an insulator and there is no influence of impurity diffusion to the multilayer film 404 to be formed later, the base insulating film 402 is not necessarily provided.

Figure 9B:
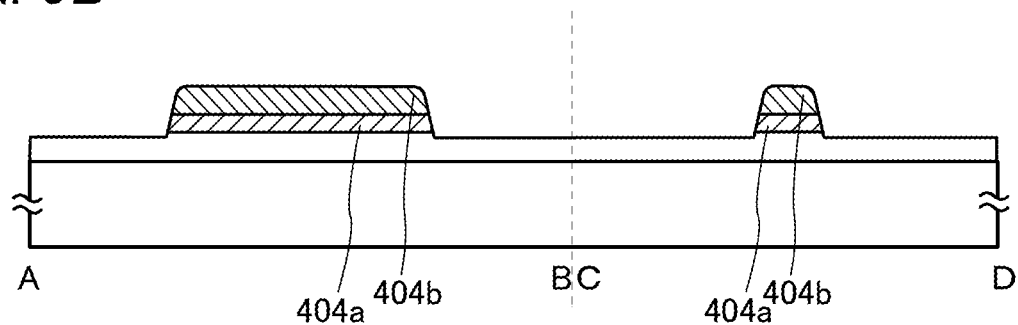

Next, the oxide semiconductor film 404a and the oxide semiconductor film 404b are formed over the base insulating film 402 by a sputtering method, a CVD method (including a MOCVD method, an ALD method, or a PECVD method), a vacuum deposition method, or a PLD method and then processed into island shapes (see FIG. 9B). At this time, as shown in FIG. 9B, the base insulating film 402 can be slightly over-etched. By over-etching of the base insulating film 402, the gate electrode 410 to be formed later can cover the oxide semiconductor film 404c easily.

For processing the oxide semiconductor film 404a and the oxide semiconductor film 404b into island shapes, first, a film to be a hard mask (e.g., a tungsten film) and a resist mask are provided over the oxide semiconductor film 404b, and the film to be a hard mask is etched into a hard mask. Then, the resist mask is removed, and with use of the hard mask, the oxide semiconductor film 404a and the oxide semiconductor film 404b are etched. After that, the hard mask is removed. An end portion of the hard mask gradually recedes as the etching progresses; accordingly, the end portion of the hard mask is rounded to have a curved surface. As a result, the end portion of the oxide semiconductor film 404b is rounded to have a curved surface. With this structure, the coverage with the oxide semiconductor film 404c, the gate insulating film 408, the gate electrode 410, and the oxide insulating film 412, which are to be formed over the oxide semiconductor film 404b, can be improved; thus, occurrence of a shape defect such as disconnection can be inhibited. In addition, electric field concentration which might occur at end portions of the source electrode 406a and the drain electrode 406b can be reduced, which can suppress deterioration of the transistor.

In order to form a continuous junction in a stack including the oxide semiconductor film 404a, the oxide semiconductor film 404b, and the oxide semiconductor film 404c that is to be formed in a later step, the layers need to be formed successively without exposure to the air with use of a multi-chamber deposition apparatus (e.g., a sputtering apparatus) including a load lock chamber. It is preferable that each chamber of the sputtering apparatus be able to be evacuated to a high vacuum (to about $5 \times 10^{-7}$ Pa to $1 \times 10^{-4}$ Pa) by an adsorption vacuum pump such as a cryopump and that the chamber be able to heat a substrate over which a film is to be deposited to 100° C. or higher, preferably, 500° C. or higher so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

The materials described in Embodiment 2 can be used for the oxide semiconductor film 404a, the oxide semiconductor film 404b, and the oxide semiconductor film 404c that is to be formed in a later step. For example, an In—Ga—Zn oxide whose atomic ratio of In to Ga and Zn is 1:3:4 or 1:3:2 can be used for the oxide semiconductor film 404a, an In—Ga—Zn oxide whose atomic ratio of In to Ga and Zn is 1:1:1 can be used for the oxide semiconductor film 404b, and an In—Ga—Zn oxide whose atomic ratio of In to Ga and Zn is 1:3:4 or 1:3:2 can be used for the oxide semiconductor film 404c.

An oxide semiconductor that can be used for each of the oxide semiconductor film 404a, the oxide semiconductor film 404b, and the oxide semiconductor film 404c preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that here, for example, an "In—Ga—Zn oxide" means an oxide containing In, Ga, and Zn as its main components. The In—Ga—Zn oxide may contain another metal element in addition to In, Ga, and Zn. Further, in this specification, a film formed using an In—Ga—Zn oxide is also referred to as an IGZO film.

Alternatively, a material represented by $InMO_3(ZnO)_m$ (m>0 is satisfied, and m is not an integer) may be used. Note that M represents one or more metal elements selected from Ga, Fe, Mn, or Co. Alternatively, a material represented by $In_2SnO_5(ZnO)_n$ (n>0, n is an integer) may be used.

Note that as described in Embodiment 2 in detail, materials are selected so that the oxide semiconductor film 404a and the oxide semiconductor film 404c each have an electron affinity lower than that of the oxide semiconductor film 404b.

Note that the oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case of using an In—Ga—Zn oxide, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used for the oxide semiconductor film 404a, the oxide semiconductor film 404b, and the oxide semiconductor film 404c so that the oxide semiconductor film 404a and the oxide semiconductor film 404c each have an electron affinity lower than that of the oxide semiconductor film 404b.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. For example, r may be 0.05. The same applies to other oxides.

The indium content in the oxide semiconductor film 404b is preferably higher than those in the oxide semiconductor film 404a and the oxide semiconductor film 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. For this reason, with use of an oxide having a high indium content for the oxide semiconductor film 404b, a transistor having high mobility can be achieved.

A structure of the oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor film including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold value (is rarely normally on). The highly purified intrinsic or substantially highly purified intrinsic oxide semiconductor film has a low density of defect states, and thus has few carrier traps. Accordingly, the transistor including the oxide semiconductor film has little fluctuations in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With use of the CAAC-OS film in a transistor, fluctuations in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

For example, a CAAC-OS film can be deposited by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In this case, the pellet-like sputtered particle is electrically charged; without being aggregation in plasma, it reaches the substrate while maintaining its crystal state.

First heat treatment may be performed after the oxide semiconductor film 404b is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment may be performed in an atmosphere containing an oxidizing gas at 10 ppm or more, in order to compensate desorbed oxygen. By the first heat treatment, the crystallinity of the oxide semiconductor film 404b can be improved, and in addition, impurities such as hydrogen and water can be removed from the base insulating film 402 and the oxide semiconductor film 404a. Note that the first heat treatment may be performed before etching for formation of the oxide semiconductor film 404b.

A first conductive film to be the source electrode 406a and the drain electrode 406b is formed over the oxide semiconductor film 404a and the oxide semiconductor film 404b. For the first conductive film, Al, Cr, Cu, Ta, Ti, Mo, W, or an alloy material containing any of these as its main component can be used. For example, a 100-nm-thick titanium film is formed by a sputtering method or the like. Alternatively, a tungsten film may be formed by a CVD method.

Figure 9C:
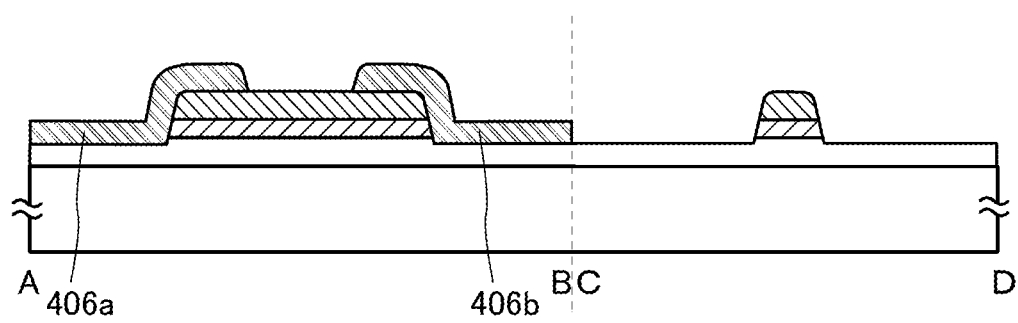

Then, the first conductive film is etched so as to be divided over the oxide semiconductor film 404b to form the source electrode 406a and the drain electrode 406b (see FIG. 9C).

Next, an oxide semiconductor film 403c is formed over the oxide semiconductor film 404b, the source electrode 406a, and the drain electrode 406b.

Note that second heat treatment may be performed after the oxide semiconductor film 403c is formed. The second heat treatment can be performed in a condition similar to that of the first heat treatment. The second heat treatment can remove impurities such as hydrogen and water from the oxide semiconductor film 403c. In addition, impurities such as hydrogen and water can be further removed from the oxide semiconductor film 404a and the oxide semiconductor film 404b.

Figure 10A:
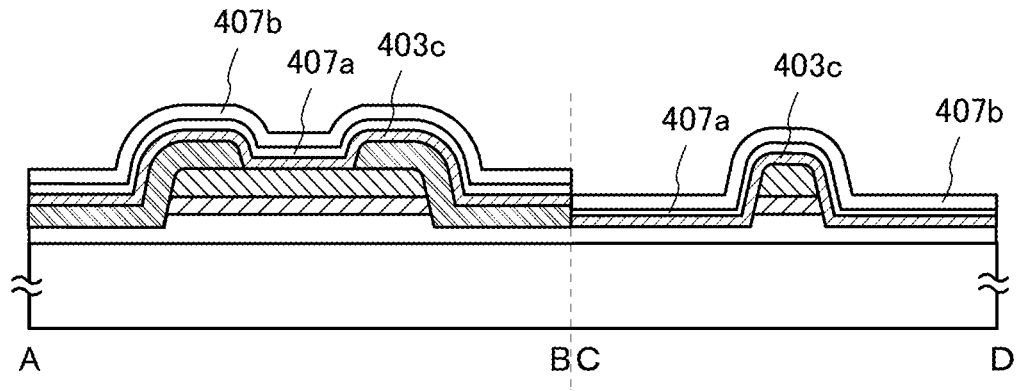
FIGS. 10A to 10C illustrate a method for manufacturing a transistor.

Next, a first insulating film 407a and a trap film 407b that are to be the gate insulating film 408 are formed over the oxide semiconductor film 403c (see FIG. 10A). The first insulating film 407a may be formed using an oxide insulating film, for example. The oxide insulating film can be formed using an insulating film containing one or more of magnesium oxide, silicon oxide, germanium oxide, yttrium oxide, zirconium oxide, lanthanum oxide, neodymium oxide, and tantalum oxide. Alternatively, a silicon nitride oxide may be used. The first insulating film 407a may be a stack of any of the above materials. As the trap film 407b, an insulating film containing silicon and nitrogen is used. Examples of the insulating film containing silicon and nitrogen include a silicon nitride film and a silicon nitride oxide film. The silicon nitride oxide film refers to a film containing more nitrogen than oxygen. Here, an example of using a silicon nitride film is described. The silicon nitride film can be formed by, for example, a CVD method (including a MOCVD method, an ALD method, or a PECVD method), a sputtering method, an MBE method, a PLD method, or the like. Alternatively, the insulating film containing silicon and nitrogen may be a stacked film in which films formed by different methods are stacked. For example, a film is formed by a CVD method, and then a film formed by a sputtering method may be stacked thereover. Alternatively, a film is formed by a sputtering method, and then a film formed by a CVD method may be stacked thereover. Further alternatively, a film formed by either a CVD method or a sputtering method may be sandwiched between films formed by the other method. Note that the thickness of the first insulating film 407a is greater than or equal to 1 nm and less than or equal to 30 nm, preferably greater than or equal to 3 nm and less than or equal to 10 nm. The thickness of the trap film 407b is greater than or equal to 1 nm and less than or equal to 30 nm, preferably greater than or equal to 5 nm and less than or equal to 20 nm.

Figure 10B:
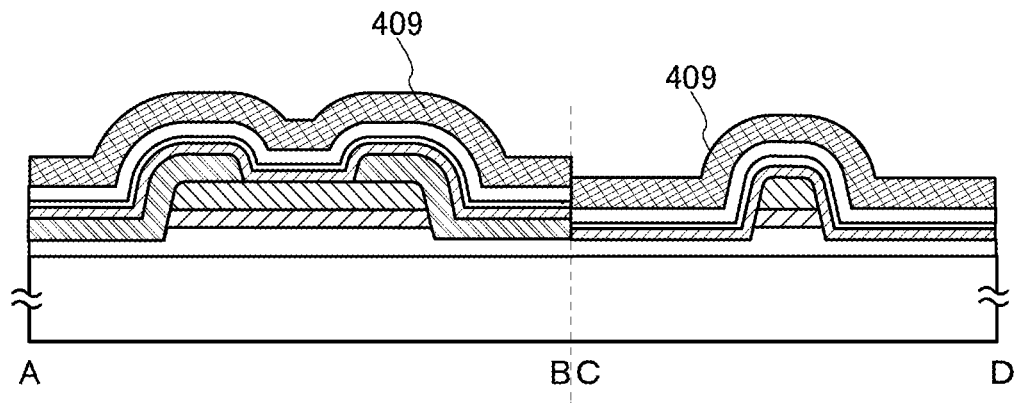

Then, a second conductive film 409 to be the gate electrode 410 is formed over the trap film 407b (see FIG. 10B). For the second conductive film 409, Al, Ti, Cr, Co, Ni, Cu, Y, Zr, Mo, Ru, Ag, Ta, W, or an alloy material containing any of these as its main component can be used. The second conductive film 409 can be formed by a sputtering method, a CVD method, or the like. For the second conductive film 409, a conductive film containing nitrogen or a stack including the above conductive film and a conductive film containing nitrogen may be used.

Figure 10C:
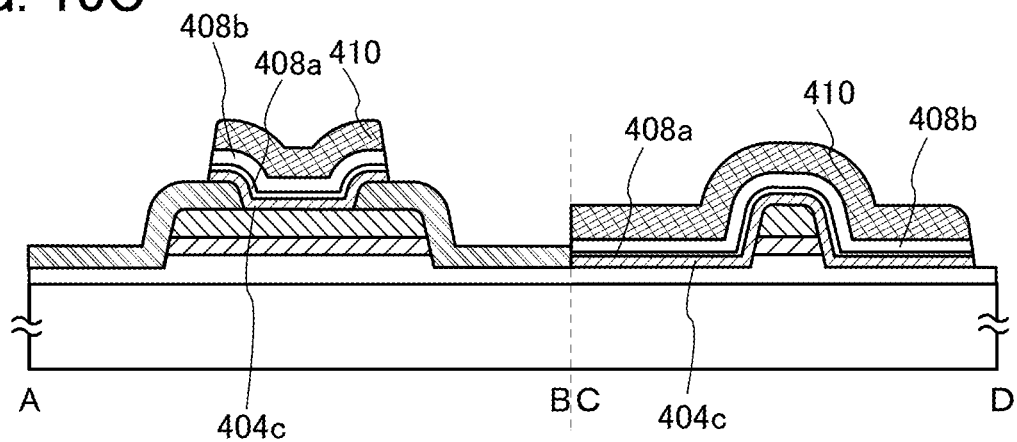

Next, the second conductive film 409 is selectively etched using a resist mask to form the gate electrode 410 (see FIG. 10C). Note that the gate electrode 410 is formed so as to electrically cover the oxide semiconductor film 404b as illustrated in FIG. 5C.

Then, the first insulating film 407a and the trap film 407b are selectively etched using the resist mask or the gate electrode 410 as a mask to form the gate insulating film 408.

Then, the oxide semiconductor film 403c is etched using the resist mask or the gate electrode 410 as a mask to form the oxide semiconductor film 404c.

A top end portion of the oxide semiconductor film 404c is aligned with a bottom end portion of the gate insulating film 408. A top end portion of the gate insulating film 408 is aligned with a bottom end portion of the gate electrode 410. Although the gate insulating film 408 and the oxide semiconductor film 404c are formed using the gate electrode 410 as a mask, the gate insulating film 408 and the oxide semiconductor film 404c may be formed before the second conductive film 409 is formed.

Next, the oxide insulating film 412 is formed over the source electrode 406a, the drain electrode 406b, and the gate electrode 410 (see FIGS. 5B and 5C). A material and a formation method of the oxide insulating film 412 can be similar to those of the base insulating film 402. The oxide insulating film 412 may be formed using aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or an oxide insulating film containing nitrogen. The oxide insulating film 412 can be formed by a sputtering method, a CVD method (including a MOCVD method, an ALD method, or a PECVD method), an MBE method, or a PLD method, and is preferably formed to contain excess oxygen so as to be able to supply oxygen to the multilayer film 404.

Oxygen may be added to the oxide insulating film 412 by an ion implantation method, an ion doping method, a plasma immersion ion implantation method, or the like. Adding oxygen enables the oxide insulating film 412 to supply oxygen much easily to the multilayer film 404.

Next, third heat treatment may be performed. The third heat treatment can be performed under a condition similar to that of the first heat treatment. By the third heat treatment, excess oxygen is easily released from the base insulating film 402, the gate insulating film 408, and the oxide insulating film 412, so that oxygen vacancies in the multilayer film 404 can be reduced.

Next, fourth heat treatment is performed. The fourth heat treatment is performed at a temperature higher than or equal to 125° C. and lower than or equal to 450° C., preferably higher than or equal to 150° C. and lower than or equal to 300° C. under conditions where the potential of the gate electrode 410, which is higher than those of the source and the drain, is kept for a second or more, typically one minute or more, so that necessary electrons transfer from the multilayer film 404 toward the gate electrode 410, and some of the electrons are trapped in an electron trap state. In such a manner, the amount of trapped electrons is adjusted, whereby the rate of increase in the threshold value is adjusted.

Through the above process, the transistor 450 illustrated in FIGS. 5A to 5C can be fabricated.

This embodiment can be combined with any of the other embodiments in this specification as appropriate.

Embodiment 4

In this embodiment, a transistor having a planar structure that is different from that of the transistor described in Embodiment 2 will be described.

Figure 11A:
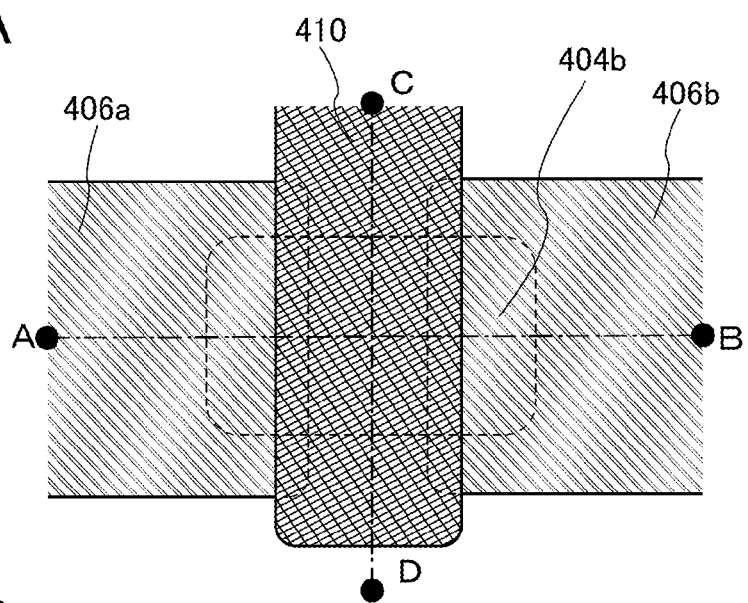
FIGS. 11A to 11C are a top view and cross-sectional views illustrating a transistor.
Figure 11B:
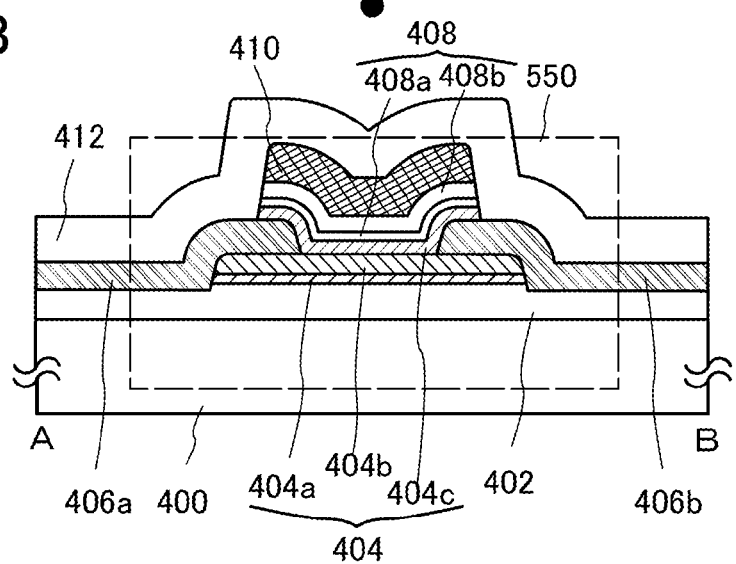
Figure 11C:
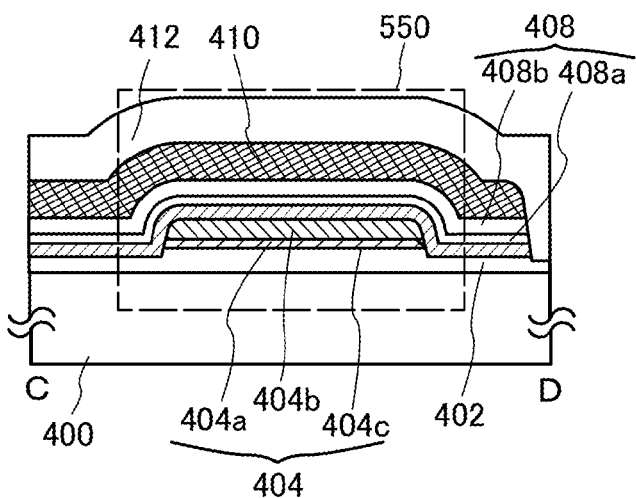

FIGS. 11A to 11C are a top view and cross-sectional views which illustrate a transistor of one embodiment of the present invention. FIG. 11A is the top view. FIG. 11B illustrates a cross section taken along the dashed-dotted line A-B in FIG. 11A. FIG. 11C illustrates a cross section taken along the dashed-dotted line C-D in FIG. 11A. Note that for simplification of the drawing, some components in the top view in FIG. 11A are not illustrated. In some cases, the direction of the dashed-dotted line A-B is referred to as a channel length direction, and the direction of the dashed-dotted line C-D is referred to as a channel width direction.

A transistor 550 illustrated in FIGS. 11A to 11C includes the following components: the base insulating film 402 over the substrate 400; the oxide semiconductor film 404a and the oxide semiconductor film 404b over the base insulating film 402; the source electrode 406a and the drain electrode 406b over the oxide semiconductor film 404a and the oxide semiconductor film 404b; the oxide semiconductor film 404c in contact with the base insulating film 402, the oxide semiconductor film 404a, the oxide semiconductor film 404b, the source electrode 406a, and the drain electrode 406b; the gate insulating film 408 over the oxide semiconductor film 404c; the gate electrode 410 over the gate insulating film 408; and the oxide insulating film 412 over the source electrode 406a, the drain electrode 406b, and the gate electrode 410. The gate insulating film 408 includes the first insulating film 408a and the trap film 408b and functions as a charge trap layer described in Embodiment 1. The oxide semiconductor film 404a, the oxide semiconductor film 404b, and the oxide semiconductor film 404c are collectively referred to as the multilayer film 404.

Figure 12A:
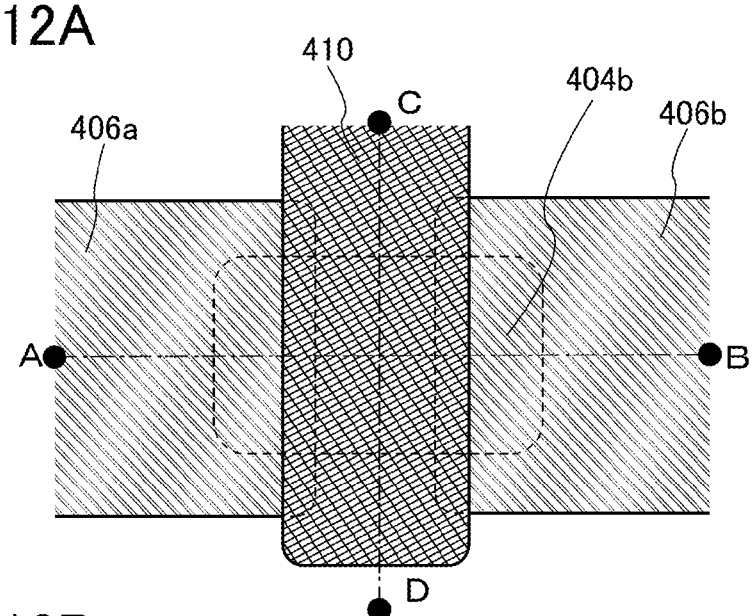
FIGS. 12A to 12C are a top view and cross-sectional views illustrating a transistor.
Figure 12B:
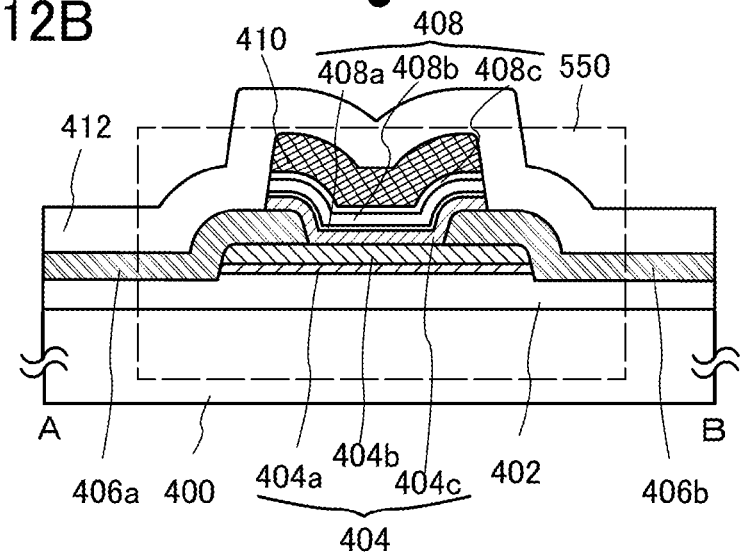
Figure 12C:
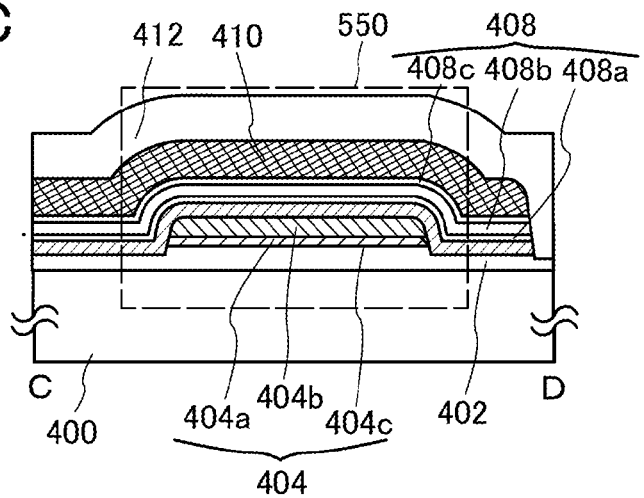

Note that the second insulating film 408c may be formed over the trap film 408b as illustrated in FIGS. 12A to 12C.

A difference between the transistor 450 in Embodiment 2 and the transistor 550 in this embodiment lies in that whether the gate electrode 410 completely covers the side surfaces of the oxide semiconductor film 404b. In the transistor 550, the gate electrode 410 does not completely cover the side surfaces of the oxide semiconductor film 404b.

Note that the channel length indicates a distance between a source (source region or source electrode) and a drain (drain region or drain electrode) in a region where the semiconductor film and the gate electrode overlap with each other when seen in the top view. In other words, the channel length seen in FIG. 11A indicates a distance between the source electrode 406a and the drain electrode 406b in a region where the oxide semiconductor film 404b and the gate electrode 410 overlap with each other. The channel width indicates a length of a portion of the source that faces the drain in the region where the semiconductor film and the gate electrode overlap with each other. In other words, the channel width seen in FIG. 11A indicates the length of a portion of the source electrode 406a that faces the drain electrode 406b in the region where the oxide semiconductor film 404b and the gate electrode 410 overlap with each other.

The gate insulating film 408 (the first insulating film 408a and the trap film 408b) functions as a charge trap layer, whereby charge can be trapped in the charge trap state existing in an interface between the first insulating film 408a and the trap film 408b or inside the trap film 408b as described in Embodiment 1. At this time, the amount of charges trapped in the charge trap state can be adjusted by the potential of the gate electrode 410.

The amount of trapped charges can be adjusted to constant by the potential of the gate electrode 410, and thus the rate of increase in the threshold value can be controlled.

Furthermore, miniaturization of the transistor enables an increase in integration, which leads to high density. For example, the channel length of the transistor is less than or equal to 100 nm, preferably less than or equal to 40 nm, further preferably less than or equal to 30 nm, still further preferably less than or equal to 20 nm and the channel width of the transistor is less than or equal to 100 nm, preferably less than or equal to 40 nm, further preferably less than or equal to 30 nm, still further preferably less than or equal to 20 nm.

Figure 13A:
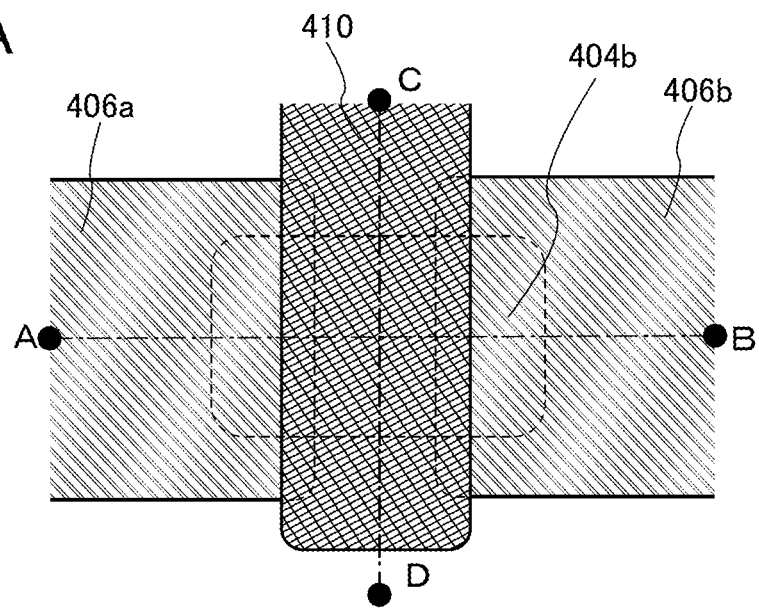
FIGS. 13A to 13C are a top view and cross-sectional views illustrating a transistor.
Figure 13B:
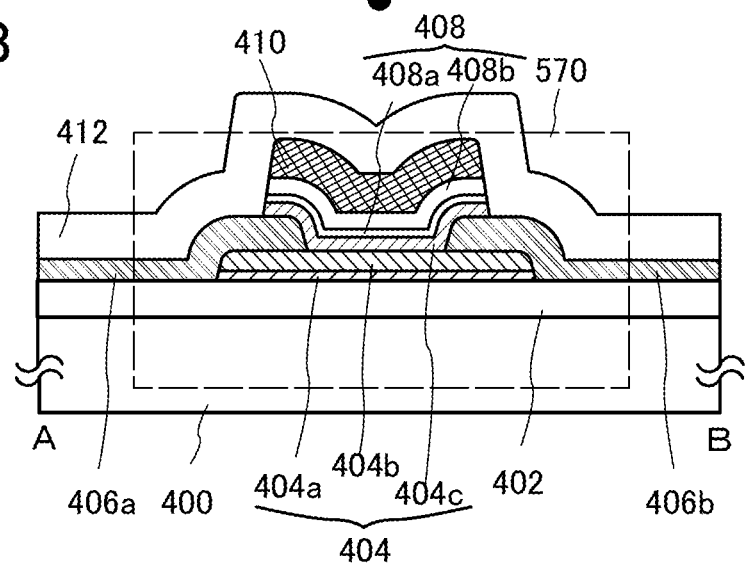
Figure 13C:
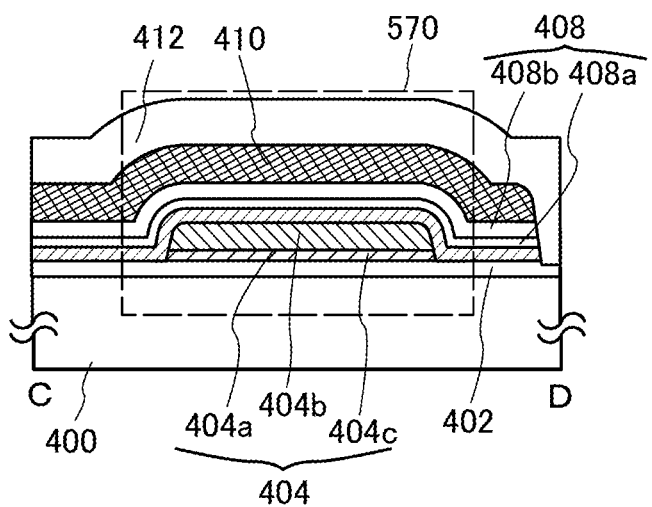

Alternatively, a transistor 570 illustrated in FIGS. 13A to 13C can be employed. FIGS. 13A to 13C are a top view and cross-sectional views which illustrate the transistor 570. FIG. 13A is the top view. FIG. 13B illustrates a cross section taken along the dashed-dotted line A-B in FIG. 13A. FIG. 13C illustrates a cross section taken along the dashed-dotted line C-D in FIG. 13A. Note that for simplification of the drawing, some components in the top view in FIG. 13A are not illustrated.

In the transistor 570, the base insulating film 402 is not etched because a conductive film that is to be the source electrode 406a and the drain electrode 406b is not over-etched in a step of forming the source electrode 406a and the drain electrode 406b.

In order to prevent etching of the base insulating film 402 caused by over-etching of the conductive film, the etching selectivity of the conductive film to the base insulating film 402 is high.

Although in this embodiment, the oxide semiconductor film 404b is sandwiched between the oxide semiconductor film 404a and the oxide semiconductor film 404c, the oxide semiconductor film is not limited to this structure. A structure in which neither the oxide semiconductor film 404a nor the oxide semiconductor film 404c is provided and the oxide semiconductor film 404b is only provided may be employed.

This embodiment can be combined with any of the other embodiments in this specification as appropriate.

Embodiment 5

In this embodiment, a method for forming the transistor 550, which is described in Embodiment 4 with reference to FIGS. 11A to 11C, is described with reference to FIGS. 14A to 14C and FIGS. 15A to 15C.

Figure 14A:
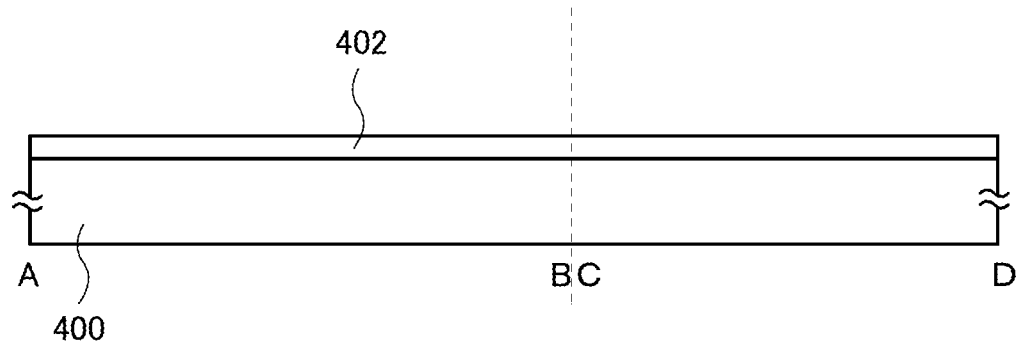
FIGS. 14A to 14C illustrate a method for manufacturing a transistor.

First, the base insulating film 402 is formed over the substrate 400 (see FIG. 14A). The above embodiment can be referred to for materials and a formation method of the substrate 400 and the base insulating film 402.

Figure 14B:
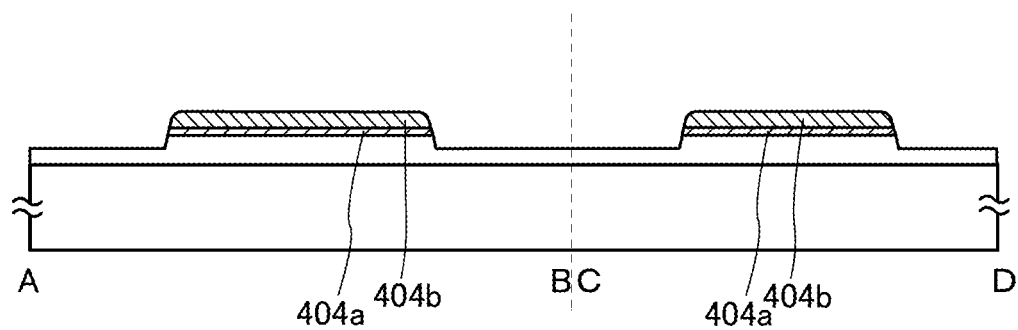

Next, the oxide semiconductor film 404a and the oxide semiconductor film 404b are formed over the base insulating film 402 by a sputtering method, a CVD method (including a MOCVD method, an ALD method, or a PECVD method), an MBE method, or a PLD method and then processed into island shapes (see FIG. 14B). At this time, as shown in FIG. 14B, the base insulating film 402 can be slightly over-etched. By over-etching of the base insulating film 402, the gate electrode 410 to be formed later can cover the oxide semiconductor film 404c easily. The above embodiment can be referred to for materials and formation methods of the oxide semiconductor film 404a and the oxide semiconductor film 404b.

For processing the oxide semiconductor film 404a and the oxide semiconductor film 404b into island shapes, first, a film to be a hard mask and a resist mask are provided over the oxide semiconductor film 404b, and the film to be a hard mask is etched into a hard mask. Then, the resist mask is removed, and the oxide semiconductor film 404a and the oxide semiconductor film 404b are etched using the hard mask as a mask. After that, the hard mask is removed.

Figure 14C:
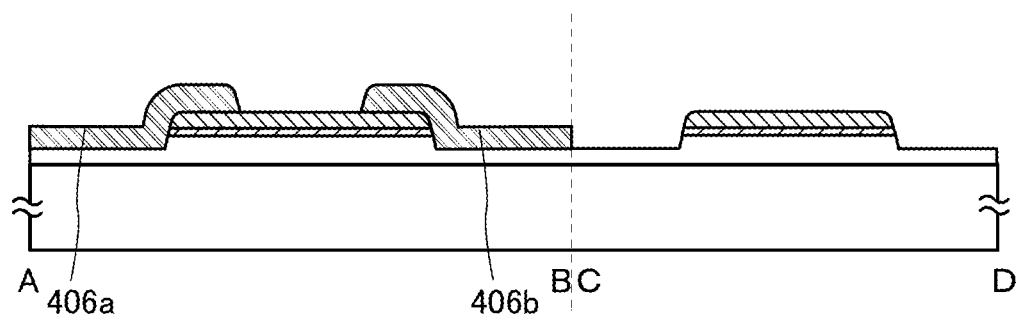

Then, the source electrode 406a and the drain electrode 406b are formed (see FIG. 14C). The above embodiments can be referred to for materials and formation methods of the source electrode 406a and the drain electrode 406b.

Figure 15A:
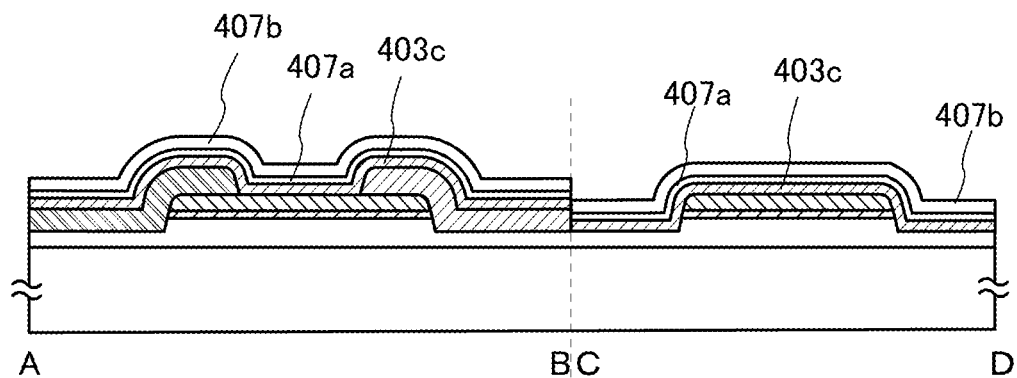
FIGS. 15A to 15C illustrate a method for manufacturing a transistor.

Next, the oxide semiconductor film 403c is formed over the oxide semiconductor film 404b, the source electrode 406a, and the drain electrode 406b, and the first insulating film 407a and the trap film 407b that are to be the gate insulating film 408 are formed over the oxide semiconductor film 403c (see FIG. 15A). The above embodiment can be referred to for materials and formation methods of the oxide semiconductor film 403c, the first insulating film 407a, and the trap film 407b.

Figure 15B:
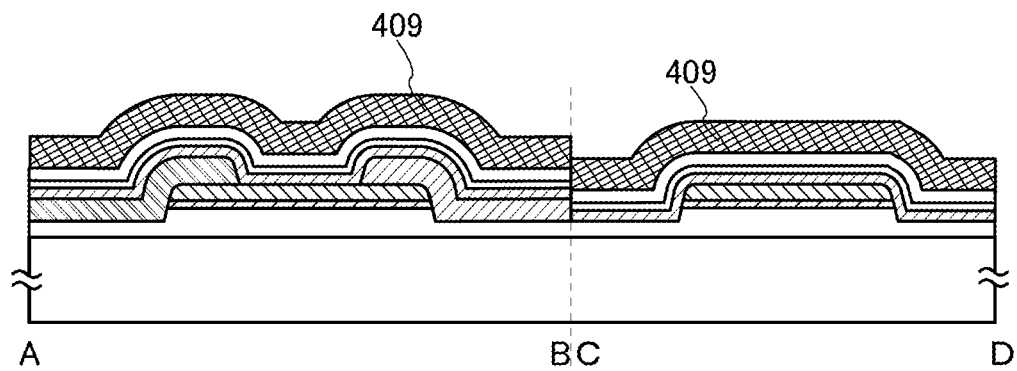

Then, the second conductive film 409 to be the gate electrode 410 is formed over the trap film 407b (see FIG. 15B). The above embodiment can be referred to for a material and formation method of the second conductive film 409.

Figure 15C:
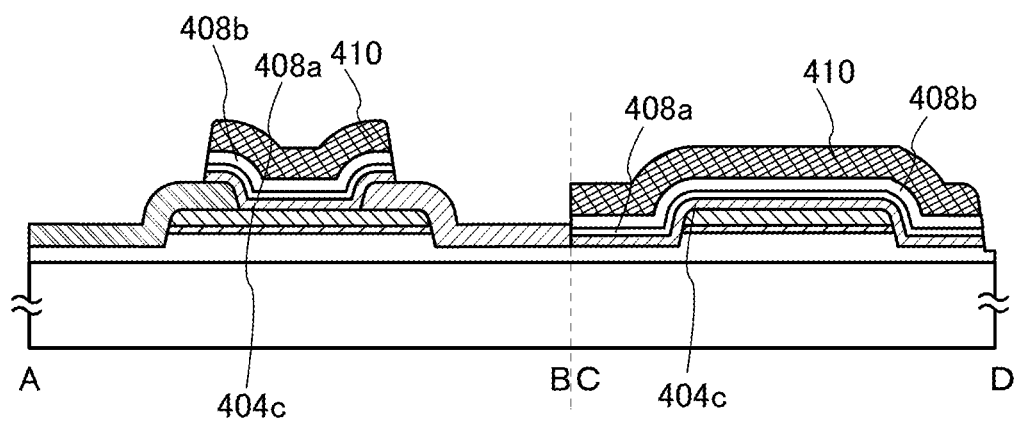

Next, the second conductive film 409 is selectively etched using a resist mask to form the gate electrode 410 (see FIG. 15C).

Subsequently, the first insulating film 407a and the trap film 407b are selectively etched using the resist mask or the gate electrode 410 as a mask to form the first insulating film 408a and the trap film 408b that are to be the gate insulating film 408.

Subsequently, the oxide semiconductor film 403c is etched using the resist mask or the gate electrode 410 as a mask to form the oxide semiconductor film 404c.

A top end portion of the oxide semiconductor film 404c is aligned with a bottom end portion of the gate insulating film 408. A top end portion of the gate insulating film 408 is aligned with a bottom end portion of the gate electrode 410. Although the gate insulating film 408 and the oxide semiconductor film 404c are formed using the gate electrode 410 as a mask, the gate insulating film 408 and the oxide semiconductor film 404c may be formed before the second conductive film 409 is formed.

Next, the oxide insulating film 412 is formed over the source electrode 406a, the drain electrode 406b, and the gate electrode 410. The above embodiment can be referred to for a material and formation method of the oxide insulating film 412.

Next, heat treatment is performed. The heat treatment is performed at a temperature higher than or equal to 125° C. and lower than or equal to 450° C., preferably higher than or equal to 150° C. and lower than or equal to 300° C. under conditions where the potential of the gate electrode 410, which is higher than those of the source and the drain, is kept for a second or more, typically one minute or more, so that necessary electrons transfer from the multilayer film 404 toward the gate electrode 410, and some of the electrons are trapped in an electron trap state. In such a manner, the amount of trapped electrons is adjusted, whereby the rate of increase in the threshold value is adjusted.

Through the above process, the transistor 550 illustrated in FIGS. 11A to 11C can be fabricated.

This embodiment can be combined with any of the other embodiments in this specification as appropriate.

Embodiment 6

In this embodiment, an example of a circuit including the transistor of one embodiment of the present invention will be described with reference to the drawings.

FIGS. 16A and 16B are each a circuit diagram of a semiconductor device and FIGS. 16C and 16D are each a cross-sectional view of a semiconductor device. FIGS. 16C and 16D each illustrate a cross sectional of the transistor 450 in a channel length direction on the left and a cross sectional of the transistor 450 in a channel width direction on the right. In the circuit diagram, "OS" is written beside a transistor in order to clearly demonstrate that the transistor includes an oxide semiconductor.

The semiconductor devices illustrated in FIGS. 16C and 16D each include a transistor 2200 containing a first semiconductor material in a lower portion and a transistor containing a second semiconductor material in an upper portion. Here, an example is described in which the transistor 450 described in Embodiment 2 is used as the transistor containing the second semiconductor material. Note that each of the semiconductor devices illustrated in FIG. 16C and FIG. 16D is an example in which part of the oxide semiconductor film 406b is etched in formation of the source electrode 406a and the drain electrode 406b.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in Embodiment 2 can be used as the second semiconductor material. A transistor using a material other than an oxide semiconductor, such as single crystal silicon, can operate at high speed easily. In contrast, a transistor including an oxide semiconductor has a small amount of off-state current.

Although the transistor 2200 is a p-channel transistor here, it is needless to say that an n-channel transistor can be used to form a circuit having a different configuration. The specific structure of the semiconductor device, such as the material used for the semiconductor device and the structure of the semiconductor device, is not necessarily limited to those described here except for the use of the transistor described in Embodiment 2, which is formed using an oxide semiconductor.

FIGS. 16A, 16C, and 16D each illustrate a configuration example of what is called a CMOS circuit, in which a p-channel transistor and an n-channel transistor are connected in series and gates of the transistors are connected.

The circuit can operate at high speed because the transistor of one embodiment of the present invention including an oxide semiconductor has a large amount of on-state current.

In the structure illustrated in FIG. 16C, the transistor 450 is provided over the transistor 2200 with an insulating film 2201 positioned therebetween. Wirings 2202 are provided between the transistor 2200 and the transistor 450. Wirings and electrodes in the upper layer and the lower layer are electrically connected via plugs 2203 embedded in insulating films. An insulating film 2204 covering the transistor 450, a wiring 2205 over the insulating film 2204, and a wiring 2206 formed by processing the same conductive film as the pair of electrodes of the transistor 450 are provided.

When two transistors are stacked as described above, the area occupied by the circuit can be reduced and a plurality of circuits can be arranged with higher density.

In FIG. 16C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 16D, an opening portion in which the plug 2203 is embedded is provided in a gate insulating film of the transistor 450, and the gate of the transistor 450 is in contact with the plug 2203 in the opening portion. Such a configuration makes it possible to achieve the integration of the circuit easily and to reduce the lengths and the number of wirings and plugs to be smaller than those in the configuration illustrated in FIG. 16C; thus, the circuit can operate at higher speed.

Note that when a connection between the electrodes of the transistor 450 and the transistor 2200 is changed from that in the configuration illustrated in FIG. 16C or FIG. 16D, a variety of circuits can be formed. For example, a circuit having a configuration in which a source and a drain of a transistor are connected to those of another transistor as illustrated in FIG. 16B can operate as what is called an analog switch.

A semiconductor device having an image sensor function for reading data of an object can be fabricated with use of the transistor described in any of the above embodiments.

Figure 17:
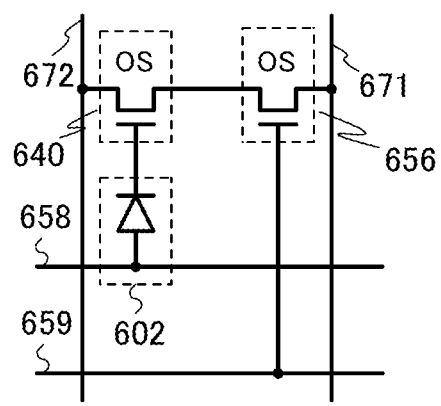
FIG. 17 is an equivalent circuit diagram illustrating an example of a semiconductor device.

FIG. 17 illustrates an example of an equivalent circuit of a semiconductor device having an image sensor function.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data on an object to be detected can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 17, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor film is electrically covered with the gate electrode. When the oxide semiconductor film has round end portions and a curved surface in the transistor, coverage with a film formed over the oxide semiconductor film can be improved. In addition, electric field concentration which might occur at end portions of the source electrode and the drain electrode can be reduced, which can suppress deterioration of the transistor. Therefore, a variation in the electric characteristics of the transistor 640 and the transistor 656 is suppressed, and the transistor 640 and the transistor 656 are electrically stable. With the transistor, the semiconductor device having an image sensor function, which is illustrated in FIG. 17, can be highly reliable.

This embodiment can be combined with any of the other embodiments in this specification as appropriate.

Embodiment 7

In this embodiment, an example of a semiconductor device (memory device) which includes a transistor according to one embodiment of the present invention, which can hold stored data even when not powered, and which has an unlimited number of write cycles will be described with reference to drawings.

Figure 18:
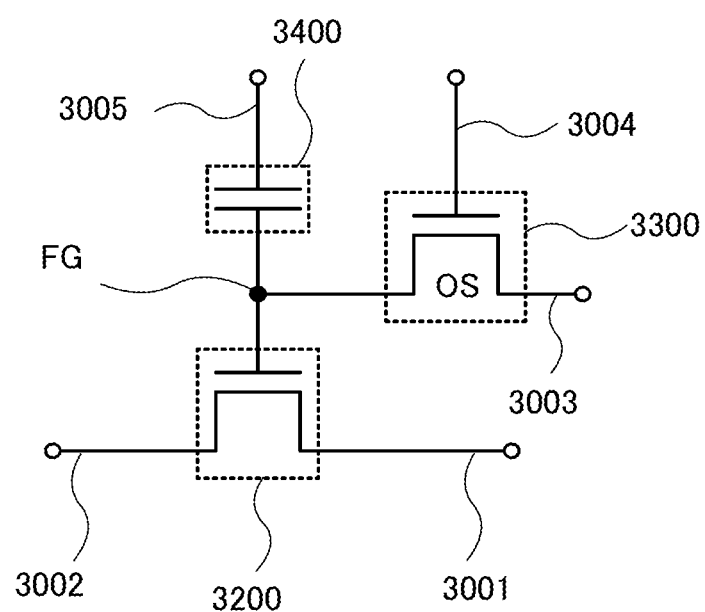
FIG. 18 is an equivalent circuit diagram of a semiconductor device of an embodiment.

FIG. 18 is a circuit diagram of the semiconductor device.

The semiconductor device illustrated in FIG. 18 includes a transistor 3200 including a first semiconductor material, a transistor 3300 including a second semiconductor material, and a capacitor 3400. Note that the transistor shown in Embodiment 2 can be used as the transistor 3300.

The transistor 3300 is a transistor in which a channel is formed in a semiconductor layer including an oxide semiconductor. Since the amount of off-state current of the transistor 3300 is small, stored data can be retained for a long period owing to such a transistor. In other words, power consumption can be sufficiently reduced because a semiconductor device in which refresh operation is unnecessary or the frequency of refresh operation is extremely low can be provided.

In FIG. 18, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 18 utilizes a feature that the potential of the gate electrode of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the amount of off-state current of the transistor 3300 is extremely small, the charge of the gate electrode of the transistor 3200 is held for a long time.

Next, reading of data will be described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential higher than $V_{th\_L}$ may be applied to the fifth wiring 3005.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

As described above, a miniaturized and highly integrated semiconductor device having favorable electrical characteristics can be provided.

Embodiment 8

In this embodiment, description is given of a CPU in which at least the transistor described in any of the above embodiments can be used and the memory device described in the above embodiment is included.

Figure 19:
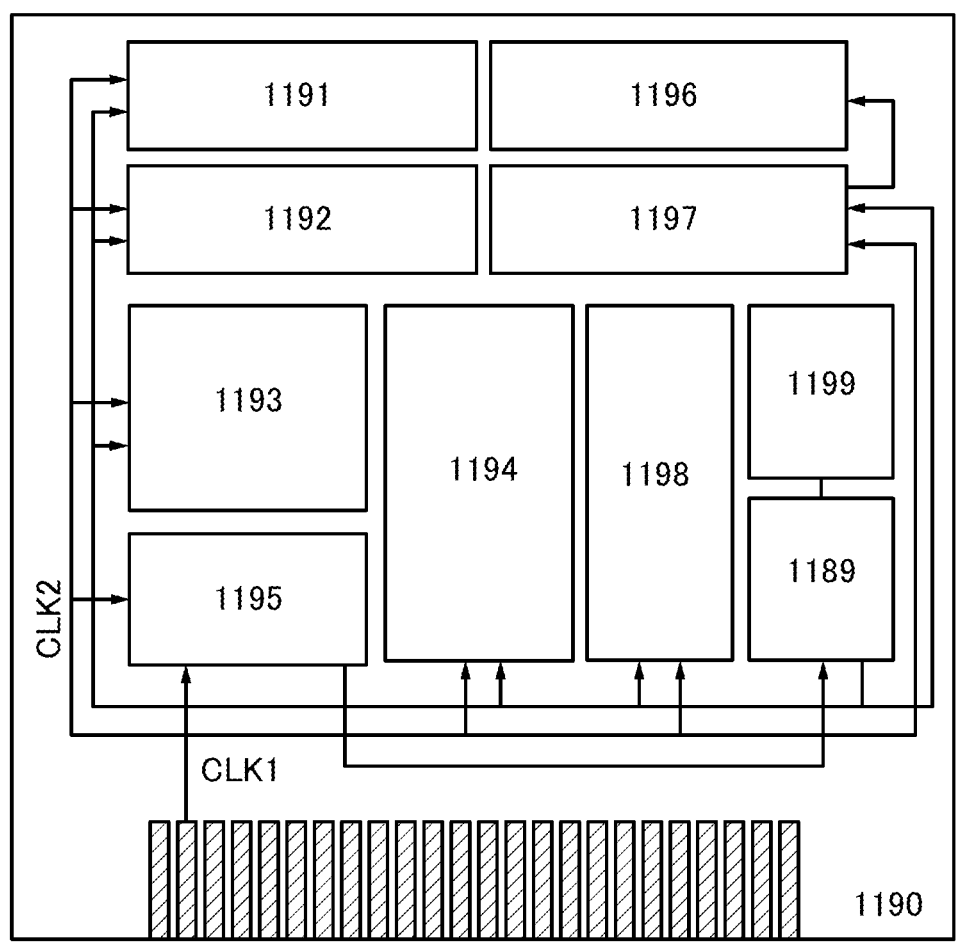
FIG. 19 is a block diagram of a semiconductor device of an embodiment.

FIG. 19 is a block diagram illustrating a configuration example of a CPU at least partly including the transistor shown in Embodiment 2.

The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 19 is just an example in which the configuration has been simplified, and an actual CPU may have various configurations depending on the application. For example, the CPU may have the following configuration: assuming that a structure including the CPU illustrated in FIG. 19 or an arithmetic circuit is regarded as one core, a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 19, a memory cell is provided in the register 1196. For the memory cell of the register 1196, any of the transistors described in the above embodiments can be used.

In the CPU illustrated in FIG. 19, the register controller 1197 selects operation of storing data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and the supply of power supply voltage to the memory cell in the register 1196 can be stopped.

Figure 20:
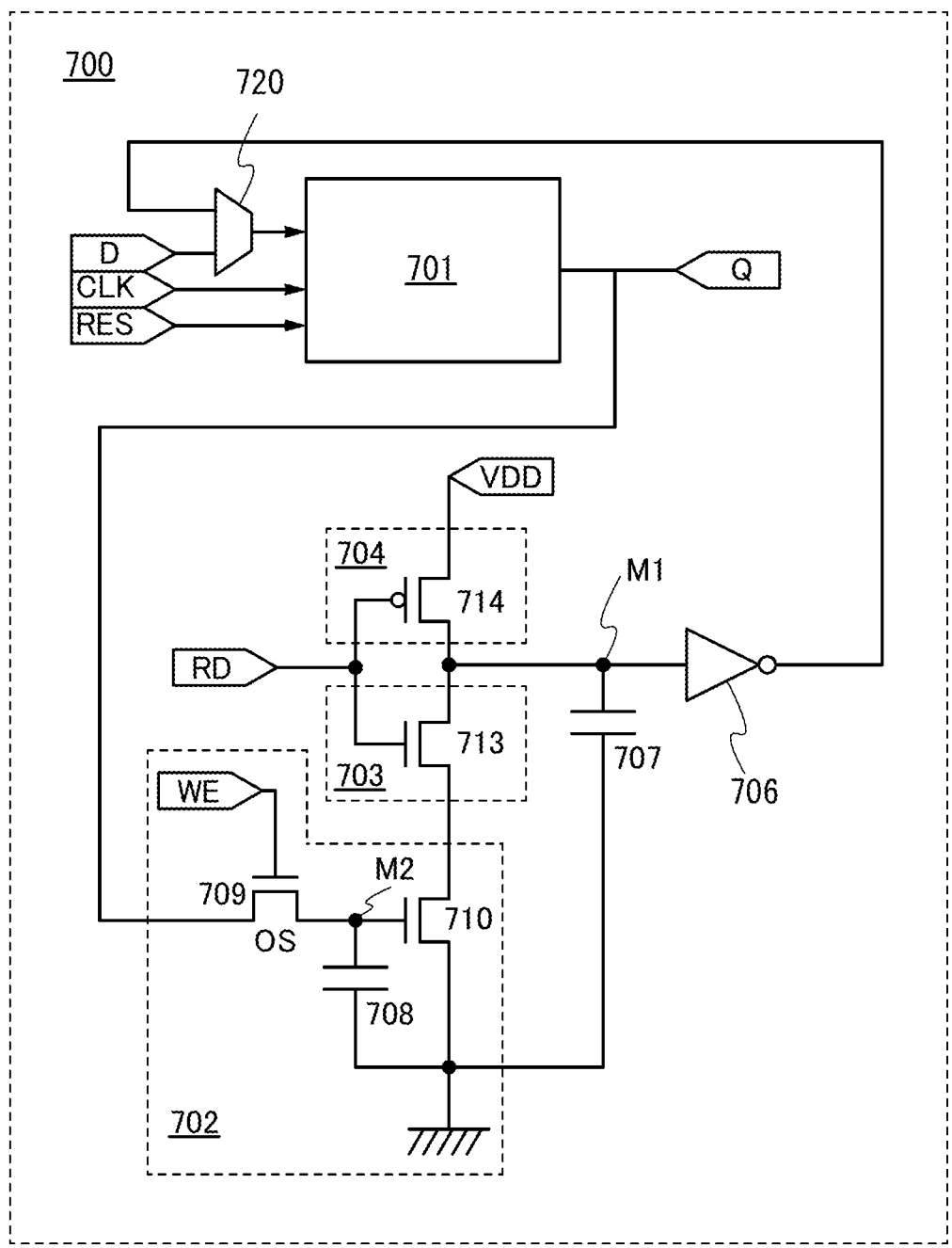
FIG. 20 is a circuit diagram of a memory device of an embodiment.

FIG. 20 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in the above embodiment can be used as the circuit 702. When the supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the gate (gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 20 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 20, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

With use of the transistor described in Embodiment 2, Icut of the transistor 709 in FIG. 17 can be further reduced. Note that as the transistor 709, a transistor having a second gate may be used.

In FIG. 20, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor film can be used for all the transistors used for the memory element 700. Further alternatively, in the memory element 700, a transistor in which a channel is formed in an oxide semiconductor film can be included besides the transistor 709, and a transistor in which a channel is formed in a layer or the substrate 1190 including a semiconductor other than an oxide semiconductor can be used for the rest of the transistors.

As the circuit 701 in FIG. 20, for example, a flip-flop circuit can be used. As the logic element 706, for example, an inverter, a clocked inverter, or the like can be used.

In the semiconductor device of one embodiment of the present invention, in a period during which the memory element 700 is not supplied with the power supply voltage, data stored in the circuit 701 can be held by the capacitor 708 which is provided in the circuit 702.

The amount of off-state current of a transistor in which a channel is formed in an oxide semiconductor film is extremely small. For example, the amount of off-state current of a transistor in which a channel is formed in an oxide semiconductor film is significantly smaller than that of a transistor in which a channel is formed in silicon having crystallinity. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs a pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined with any of the other embodiments disclosed in this specification as appropriate.

Embodiment 9

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention include mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like. FIG. 21A to FIG. 21F show specific examples of these electronic devices.

Figure 21A:
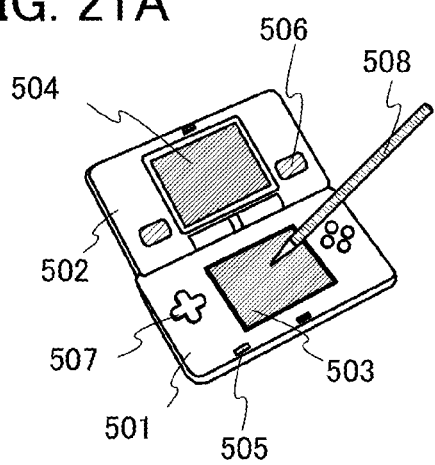
FIGS. 21A to 21F each illustrate an electronic device.

FIG. 21A illustrates a portable game machine including a housing 501, a housing 502, a display portion 503, a display portion 504, a microphone 505, a speaker 506, an operation key 507, a stylus 508, and the like. Although the portable game machine in FIG. 21A has the two display portions 503 and 504, the number of display portions included in a portable game machine is not limited to this.

Figure 21B:
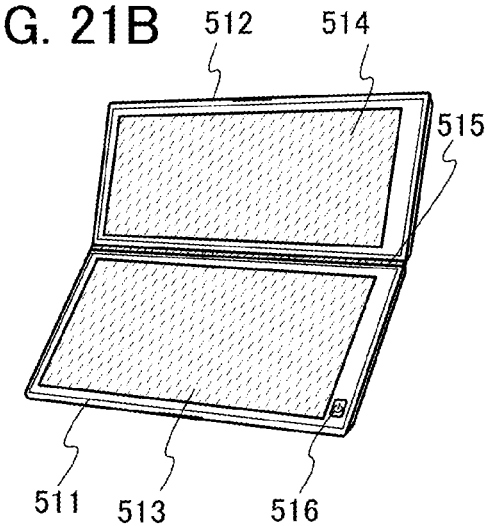

FIG. 21B illustrates a portable data appliance including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle at the joint 515 between the first housing 511 and the second housing 512. A display device with a position input function may be used as at least one of the first display portion 513 and the second display portion 514. Note that the position input function can be added by providing a touch panel in a display device. Alternatively, the position input function can be added by provision of a photoelectric conversion element called a photosensor in a pixel area of a display device.

Figure 21C:
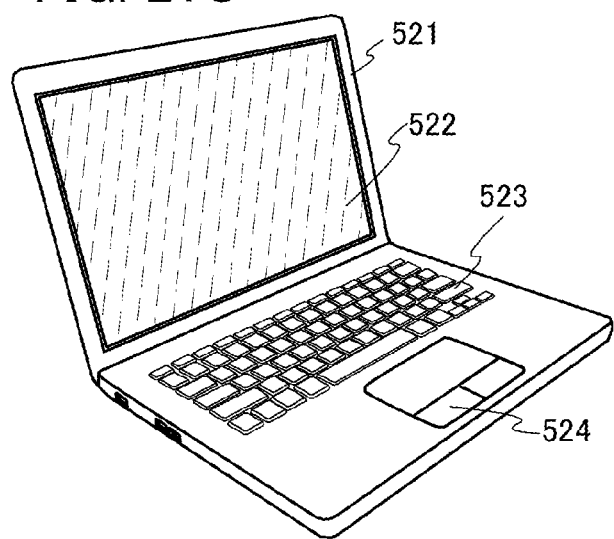

FIG. 21C illustrates a laptop personal computer, which includes a housing 521, a display portion 522, a keyboard 523, a pointing device 524, and the like.

Figure 21D:
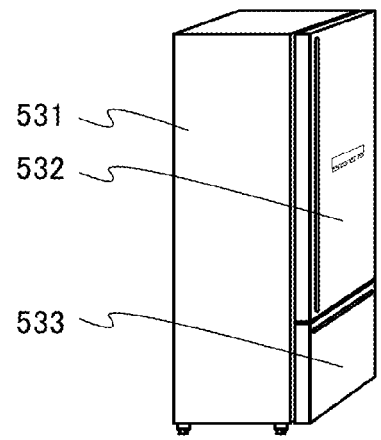

FIG. 21D illustrates an electric refrigerator-freezer including a housing 531, a door for a refrigerator 532, a door for a freezer 533, and the like.

Figure 21E:
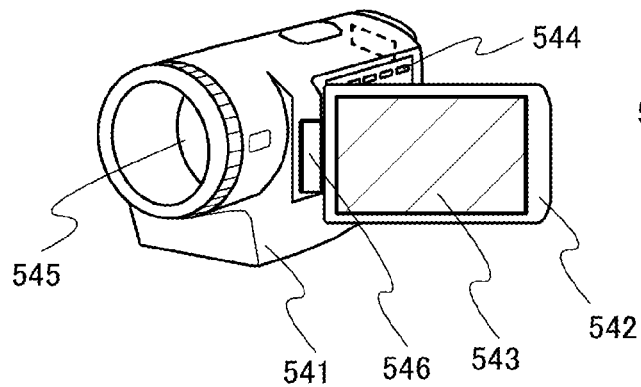

FIG. 21E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

Figure 21F:
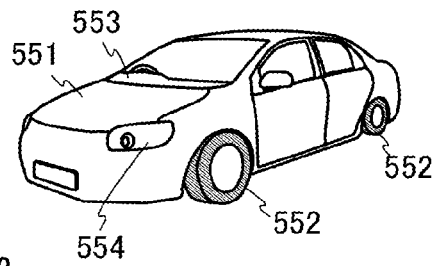

FIG. 21F illustrates a passenger car including a car body 551, wheels 552, a dashboard 553, lights 554, and the like.

This embodiment can be combined with any of the other embodiments disclosed in this specification as appropriate.

This application is based on Japanese Patent Application serial no. 2013-142340 filed with Japan Patent Office on 2013 Jul. 8, the entire contents of which are hereby incorporated by reference.

What is claimed is:

1. A method for manufacturing a semiconductor device comprising the steps of:
   forming a semiconductor film;
   forming an electrode electrically connected to the semiconductor film;
   forming a gate insulating film over the semiconductor film, the gate insulating film having a stacked structure comprising a first insulating film and a trap film;
   forming a gate electrode over the gate insulating film; and
   keeping a potential difference between the gate electrode and the electrode for one second or longer at a temperature higher than or equal to 125° C. and lower than or equal to 450° C., so that charges are trapped in the trap film and a threshold value is shifted from an initial value,
   wherein the trap film is an insulating film containing nitrogen and silicon.

2. The method for manufacturing a semiconductor device according to claim 1,
   wherein the gate insulating film further comprises a second insulating film, and
   wherein each of the first insulating film and the second insulating film is an oxide insulating film.

3. The method for manufacturing a semiconductor device according to claim 1, wherein the insulating film containing nitrogen and silicon is a silicon nitride film.

4. The method for manufacturing a semiconductor device according to claim 1, wherein the semiconductor film is an oxide semiconductor film.

5. The method for manufacturing a semiconductor device according to claim 4, wherein the oxide semiconductor film has a stacked structure.

6. The method for manufacturing a semiconductor device according to claim 1, further comprising the steps of:
   packaging the semiconductor device whose threshold value is shifted.

7. A method for manufacturing a semiconductor device comprising the steps of:
   forming a semiconductor film;
   forming an electrode electrically connected to the semiconductor film;
   forming a gate insulating film over the semiconductor film, the gate insulating film having a stacked structure comprising a first insulating film and a trap film;
   forming a gate electrode over the gate insulating film; and
   keeping a potential of the gate electrode higher than a potential of the electrode for one second or longer at a temperature higher than or equal to 125° C. and lower than or equal to 450° C., so that electrons are trapped in the trap film and a threshold value is shifted in a positive direction,
   wherein the trap film is an insulating film containing nitrogen and silicon.

8. The method for manufacturing a semiconductor device according to claim 7,
   wherein the gate insulating film further comprises a second insulating film, and wherein each of the first insulating film and the second insulating film is an oxide insulating film.

9. The method for manufacturing a semiconductor device according to claim 7, wherein the insulating film containing nitrogen and silicon is a silicon nitride film.

10. The method for manufacturing a semiconductor device according to claim 7, wherein the semiconductor film is an oxide semiconductor film.

11. The method for manufacturing a semiconductor device according to claim 10, wherein the oxide semiconductor film has a stacked structure.

12. The method for manufacturing a semiconductor device according to claim 7, further comprising the steps of:
packaging the semiconductor device whose threshold value is shifted.

13. A method for manufacturing a semiconductor device comprising the steps of:
forming a semiconductor film;
forming an electrode electrically connected to the semiconductor film;
forming a gate insulating film over the semiconductor film, the gate insulating film having a stacked structure comprising a first insulating film and a trap film;
forming a gate electrode over the gate insulating film; and
keeping a potential of the gate electrode lower than a potential of the electrode for one second or longer at a temperature higher than or equal to 125° C. and lower than or equal to 450° C., so that holes are trapped in the trap film and a threshold value is shifted in a negative direction,
wherein the trap film is an insulating film containing nitrogen and silicon.

14. The method for manufacturing a semiconductor device according to claim 13,
wherein the gate insulating film further comprises a second insulating film, and
wherein each of the first insulating film and the second insulating film is an oxide insulating film.

15. The method for manufacturing a semiconductor device according to claim 13, wherein the insulating film containing nitrogen and silicon is a silicon nitride film.

16. The method for manufacturing a semiconductor device according to claim 13, wherein the semiconductor film is an oxide semiconductor film.

17. The method for manufacturing a semiconductor device according to claim 16, wherein the oxide semiconductor film has a stacked structure.

18. The method for manufacturing a semiconductor device according to claim 13, further comprising the steps of:
packaging the semiconductor device whose threshold value is shifted.

* * * * *